US011832473B2

(12) United States Patent
Helander et al.

(10) Patent No.: US 11,832,473 B2
(45) Date of Patent: *Nov. 28, 2023

(54) OPTOELECTRONIC DEVICE INCLUDING LIGHT TRANSMISSIVE REGIONS, WITH LIGHT DIFFRACTION CHARACTERISTICS

(71) Applicant: OTI LUMIONICS INC., Mississauga (CA)

(72) Inventors: Michael Helander, Mississauga (CA); Zhibin Wang, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,840

(22) Filed: Nov. 14, 2022

(65) Prior Publication Data

US 2023/0142423 A1 May 11, 2023

Related U.S. Application Data

(63) Continuation of application No. 17/715,896, filed on Apr. 7, 2022, which is a continuation of application
(Continued)

(51) Int. Cl.
*H10K 50/85* (2023.01)
*H10K 50/822* (2023.01)
(Continued)

(52) U.S. Cl.
CPC ........... *H10K 50/85* (2023.02); *H10K 50/822* (2023.02); *H10K 59/122* (2023.02); *H10K 50/865* (2023.02)

(58) Field of Classification Search
CPC .... H10K 50/85; H10K 50/822; H10K 59/122; H10K 50/865
See application file for complete search history.

(56) References Cited

U.S. PATENT DOCUMENTS 4,022,928 A 5/1977 Piwcyzk
5,399,936 A 3/1995 Namiki et al.
(Continued)

FOREIGN PATENT DOCUMENTS

CA 2890253 A1 5/2014
CN 101299419 A 11/2008
(Continued)

OTHER PUBLICATIONS

Forrest, James A."Reductions of the glass transition temperature in thin polymer films: Probing the length scale of cooperative dynamics." Physical Review E 61.1 (2000): R53-6.
(Continued)

*Primary Examiner* — Nduka E Ojeh
(74) *Attorney, Agent, or Firm* — Foley & Lardner LLP

(57) ABSTRACT

An opto-electronic device comprises light transmissive regions extending through it along a first axis to allow passage of light therethrough. The transmissive regions may be arranged along a plurality of transverse configuration axes. Emissive regions may lie between adjacent transmissive regions along a plurality of configuration axes to emit light from the device. Each transmissive region has a lateral closed boundary having a shape to alter at least one characteristic of a diffraction pattern exhibited when light is transmitted through the device to mitigate interference by such pattern. An opaque coating may comprise at least one aperture defining a corresponding transmissive region to preclude transmission of light therethrough other than through the transmissive region(s). The device can form a face of a user device having a body and housing a transceiver positioned to receive light along at least one light transmissive region.

30 Claims, 13 Drawing Sheets

Related U.S. Application Data

No. 17/622,213, filed as application No. PCT/IB2020/056047 on Jun. 25, 2020.

(60) Provisional application No. 63/011,941, filed on Apr. 17, 2020, provisional application No. 62/867,143, filed on Jun. 26, 2019.

(51) Int. Cl.
*H10K 59/122* (2023.01)
*H10K 50/86* (2023.01)

(56) References Cited

U.S. PATENT DOCUMENTS

| | | |
|---|---|---|
| 6,016,033 A | 1/2000 | Jones et al. |
| 6,407,408 B1 | 6/2002 | Zhou et al. |
| 6,465,115 B2 | 10/2002 | Shi et al. |
| 6,538,374 B2 | 3/2003 | Hosokawa |
| 6,787,468 B2 | 9/2004 | Kim et al. |
| 6,835,950 B2 | 12/2004 | Brown et al. |
| 6,900,470 B2 | 5/2005 | Kobayashi et al. |
| 6,995,035 B2 | 2/2006 | Cok et al. |
| 7,018,713 B2 | 3/2006 | Padiyath |
| 7,099,299 B2 | 8/2006 | Liang et al. |
| 7,105,298 B2 | 9/2006 | Liu et al. |
| 7,175,815 B2 | 2/2007 | Yamasaki et al. |
| 7,363,308 B2 | 4/2008 | Dillon et al. |
| 7,402,948 B2 | 7/2008 | Yamazaki et al. |
| 7,427,783 B2 | 9/2008 | Lee et al. |
| 7,491,975 B2 | 2/2009 | Kubota |
| 7,495,389 B2 | 2/2009 | Noguchi et al. |
| 7,701,132 B2 | 4/2010 | Oh |
| 7,728,510 B2 | 6/2010 | Oh |
| 7,816,861 B2 | 10/2010 | Choi et al. |
| 7,839,083 B2 | 11/2010 | Kubota |
| 7,947,519 B2 | 5/2011 | Lee et al. |
| 7,956,351 B2 | 6/2011 | Choi |
| 7,986,672 B2 | 7/2011 | Tiedemann et al. |
| 8,004,180 B2 | 8/2011 | Seo |
| 8,030,838 B2 | 10/2011 | Kwak et al. |
| 8,044,580 B2 | 10/2011 | Yamazaki et al. |
| 8,089,066 B2 | 1/2012 | Yamazaki et al. |
| 8,115,376 B2 | 2/2012 | Fujioka et al. |
| 8,232,350 B2 | 7/2012 | Fujita et al. |
| 8,237,351 B2 | 8/2012 | Sung et al. |
| 8,310,149 B2 | 11/2012 | Lifka et al. |
| 8,343,637 B2 | 1/2013 | Parham et al. |
| 8,362,469 B2 | 1/2013 | Suh |
| 8,679,647 B2 | 3/2014 | Pflumm et al. |
| 8,766,306 B2 | 7/2014 | Lifka et al. |
| 8,795,847 B2 | 8/2014 | Heil et al. |
| 8,809,838 B2 | 8/2014 | Jeong et al. |
| 8,852,756 B2 | 10/2014 | Vestweber et al. |
| 8,872,206 B2 | 10/2014 | Chung et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,994,010 B2 | 3/2015 | Choi et al. |
| 9,018,621 B2 | 4/2015 | Park et al. |
| 9,024,307 B2 | 5/2015 | Lee |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,105,865 B2 | 8/2015 | Chung et al. |
| 9,105,867 B2 | 8/2015 | Verschuuren et al. |
| 9,126,970 B2 | 9/2015 | Pflumm |
| 9,231,030 B2 | 1/2016 | Choi et al. |
| 9,245,934 B2 | 1/2016 | Chung et al. |
| 9,246,123 B2 | 1/2016 | Kim et al. |
| 9,287,339 B2 | 3/2016 | Lee et al. |
| 9,293,515 B2 | 3/2016 | Choi |
| 9,312,312 B1 | 4/2016 | Tsai et al. |
| 9,331,308 B2 | 5/2016 | Choi et al. |
| 9,444,064 B2 | 9/2016 | Kaiser et al. |
| 9,450,027 B2 | 9/2016 | Pang et al. |
| 9,450,033 B2 | 9/2016 | Suh et al. |
| 9,461,262 B2 | 10/2016 | Malik et al. |
| 9,478,591 B2 | 10/2016 | Nam et al. |
| 9,570,471 B2 | 2/2017 | Heo et al. |
| 9,595,681 B2 | 3/2017 | Mujica-Fernaud |
| 9,624,193 B2 | 4/2017 | Aihara |
| 9,627,645 B2 | 4/2017 | Cui et al. |
| 9,660,195 B2 | 5/2017 | Kawamura et al. |
| 9,711,751 B2 | 7/2017 | Prushinskiy et al. |
| 9,748,318 B2 | 8/2017 | Shim et al. |
| 9,859,520 B2 | 1/2018 | Kim |
| 9,954,039 B2 | 4/2018 | Im et al. |
| 9,960,216 B2 | 5/2018 | Lee et al. |
| 9,966,554 B2 | 5/2018 | Lee et al. |
| 10,032,843 B2 | 7/2018 | Lee et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,177,206 B2 | 1/2019 | Jung et al. |
| 10,181,573 B2 | 1/2019 | Im |
| 10,186,568 B2 | 1/2019 | Kim et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,700,304 B2 | 6/2020 | Helander et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2006/0125390 A1 | 6/2006 | Oh |
| 2007/0077349 A1 | 4/2007 | Newman et al. |
| 2009/0199903 A1 | 8/2009 | Oyamada et al. |
| 2010/0078628 A1 | 4/2010 | Chi et al. |
| 2010/0193768 A1 | 8/2010 | Habib |
| 2010/0244197 A1 | 9/2010 | Arena et al. |
| 2011/0006289 A1 | 1/2011 | Mizuki et al. |
| 2011/0094889 A1 | 4/2011 | Shin et al. |
| 2011/0102308 A1 | 5/2011 | Nakamura et al. |
| 2011/0186820 A1 | 8/2011 | Kim et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0104422 A1 | 5/2012 | Lee et al. |
| 2012/0146030 A1 | 6/2012 | You et al. |
| 2012/0187541 A1 | 7/2012 | Arena et al. |
| 2013/0049024 A1 | 2/2013 | Choi et al. |
| 2013/0056784 A1 | 3/2013 | Lee et al. |
| 2014/0070236 A1 | 3/2014 | Chen et al. |
| 2014/0110680 A1 | 4/2014 | Choe |
| 2014/0186983 A1 | 7/2014 | Kim et al. |
| 2014/0231761 A1 | 8/2014 | Kim et al. |
| 2014/0299866 A1 | 10/2014 | Ruske et al. |
| 2014/0353601 A1 | 12/2014 | Cho et al. |
| 2015/0076456 A1 | 3/2015 | Choi et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0287846 A1 | 10/2015 | Helander et al. |
| 2015/0376768 A1 | 12/2015 | Veres et al. |
| 2016/0013438 A1 | 1/2016 | Im et al. |
| 2016/0104859 A1 | 4/2016 | Kim et al. |
| 2016/0149156 A1 | 5/2016 | Kim et al. |
| 2016/0163770 A1 | 6/2016 | Kim et al. |
| 2016/0180763 A1 | 6/2016 | Park et al. |
| 2016/0211454 A1 | 7/2016 | Kim et al. |
| 2016/0293888 A1 | 10/2016 | Shim et al. |
| 2016/0351638 A1 | 12/2016 | Im et al. |
| 2017/0018733 A1 | 1/2017 | Jin et al. |
| 2017/0033166 A1 | 2/2017 | Shim et al. |
| 2017/0062755 A1 | 3/2017 | Im et al. |
| 2017/0125495 A1 | 5/2017 | Lee et al. |
| 2017/0125506 A1 | 5/2017 | Kim |

(56) References Cited

U.S. PATENT DOCUMENTS

| | | |
|---|---|---|
| 2017/0155078 A1 | 6/2017 | Lee |
| 2017/0170246 A1 | 6/2017 | Im et al. |
| 2017/0186831 A1 | 6/2017 | Nam et al. |
| 2017/0256747 A1 | 9/2017 | Lee et al. |
| 2017/0317154 A1 | 11/2017 | Heo |
| 2017/0338438 A1 | 11/2017 | Kwon et al. |
| 2018/0006264 A1 | 1/2018 | Lee et al. |
| 2018/0040685 A1 | 2/2018 | Yeo et al. |
| 2018/0061323 A1 | 3/2018 | Kwon et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123078 A1 | 5/2018 | Byun et al. |
| 2018/0158881 A1 | 6/2018 | Lim et al. |
| 2018/0166518 A1 | 6/2018 | Kim |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0261797 A1 | 9/2018 | Lee |
| 2018/0294436 A1 | 10/2018 | Choi et al. |
| 2018/0309085 A1 | 10/2018 | Park et al. |
| 2018/0337219 A1 | 11/2018 | Rhee et al. |
| 2018/0366678 A1 | 12/2018 | Chi et al. |
| 2019/0081111 A1 | 3/2019 | Lee et al. |
| 2019/0088204 A1 | 3/2019 | Zhang et al. |
| 2019/0130822 A1 | 5/2019 | Jung et al. |
| 2019/0207156 A1* | 7/2019 | Gil .................. H10K 59/00 |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0317629 A1 | 10/2019 | Jung et al. |
| 2019/0325805 A1 | 10/2019 | Moon et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2019/0386242 A1 | 12/2019 | Choi et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0133040 A1 | 4/2020 | Bang et al. |
| 2020/0136077 A1 | 4/2020 | Lee et al. |
| 2020/0159284 A1 | 5/2020 | Mathew et al. |
| 2020/0194676 A1 | 6/2020 | Chang et al. |
| 2020/0194730 A1 | 6/2020 | Park et al. |
| 2020/0209729 A1 | 7/2020 | Chen et al. |
| 2020/0212130 A1 | 7/2020 | Kim et al. |
| 2020/0219915 A1 | 7/2020 | Kim et al. |
| 2020/0295300 A1* | 9/2020 | Chung .................. G06F 1/1684 |
| 2020/0357871 A1 | 11/2020 | Chung et al. |
| 2020/0403024 A1 | 12/2020 | Lin et al. |
| 2021/0028244 A1 | 1/2021 | Jeong et al. |
| 2021/0057494 A1 | 2/2021 | Chung et al. |
| 2021/0057496 A1 | 2/2021 | Bae et al. |
| 2021/0091157 A1* | 3/2021 | Oh .................. H10K 71/221 |
| 2021/0126059 A1 | 4/2021 | Chang et al. |
| 2021/0134926 A1 | 5/2021 | Song |
| 2021/0143231 A1 | 5/2021 | Chae et al. |
| 2021/0175297 A1 | 6/2021 | Kim |
| 2021/0175298 A1 | 6/2021 | Park |
| 2021/0175477 A1 | 6/2021 | Lim et al. |
| 2021/0183983 A1 | 6/2021 | Bang et al. |
| 2021/0184155 A1 | 6/2021 | Chae et al. |
| 2021/0191552 A1 | 6/2021 | Bok et al. |
| 2021/0193688 A1 | 6/2021 | Shin et al. |
| 2021/0193765 A1 | 6/2021 | Kim et al. |
| 2021/0193769 A1 | 6/2021 | Bok et al. |
| 2021/0193781 A1 | 6/2021 | Shim et al. |
| 2021/0202532 A1 | 7/2021 | Kim et al. |
| 2021/0202880 A1 | 7/2021 | Kim et al. |
| 2021/0210564 A1 | 7/2021 | Chae et al. |

FOREIGN PATENT DOCUMENTS

| | | |
|---|---|---|
| CN | 101617064 A | 12/2009 |
| CN | 101730938 A | 6/2010 |
| CN | 102456713 A | 5/2012 |
| CN | 102738409 A | 10/2012 |
| CN | 104037359 A | 9/2014 |
| CN | 104769149 A | 7/2015 |
| CN | 204651324 U | 9/2015 |
| CN | 105094451 A | 11/2015 |
| CN | 105097877 A | 11/2015 |
| CN | 105206650 A | 12/2015 |
| CN | 105206753 A | 12/2015 |
| CN | 106206995 A | 12/2016 |
| CN | 106992267 A | 7/2017 |
| CN | 107564945 A | 1/2018 |
| CN | 107808895 A | 3/2018 |
| CN | 108376019 A | 8/2018 |
| CN | 108389878 A | 8/2018 |
| CN | 108418928 A | 8/2018 |
| CN | 108630113 A | 10/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 208622778 U | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 110061014 A | 7/2019 |
| CN | 110112182 A | 8/2019 |
| CN | 110144551 A | 8/2019 |
| CN | 110265474 A | 9/2019 |
| CN | 110323259 A | 10/2019 |
| CN | 110365819 A | 10/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110491918 A | 11/2019 |
| CN | 110492018 A | 11/2019 |
| CN | 110518034 A | 11/2019 |
| CN | 110570774 A | 12/2019 |
| CN | 110634930 A | 12/2019 |
| CN | 110718580 A | 1/2020 |
| CN | 110727142 A | 1/2020 |
| CN | 110752249 A | 2/2020 |
| CN | 110767662 A | 2/2020 |
| CN | 110767682 A | 2/2020 |
| CN | 110767708 A | 2/2020 |
| CN | 110767709 U | 2/2020 |
| CN | 110767713 A | 2/2020 |
| CN | 110767736 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110783394 A | 2/2020 |
| CN | 110783484 A | 2/2020 |
| CN | 110783485 A | 2/2020 |
| CN | 110783486 A | 2/2020 |
| CN | 110828699 A | 2/2020 |
| CN | 110854176 A | 2/2020 |

(56) References Cited

FOREIGN PATENT DOCUMENTS

| | | |
|---|---|---|
| CN | 110867527 A | 3/2020 |
| CN | 110914891 A | 3/2020 |
| CN | 110923625 A | 3/2020 |
| CN | 110928453 A | 3/2020 |
| CN | 110956925 A | 4/2020 |
| CN | 110989861 A | 4/2020 |
| CN | 111009619 A | 4/2020 |
| CN | 111020489 A | 4/2020 |
| CN | 111029381 A | 4/2020 |
| CN | 111029382 A | 4/2020 |
| CN | 111029391 A | 4/2020 |
| CN | 111046599 A | 4/2020 |
| CN | 111048564 A | 4/2020 |
| CN | 111142180 A | 5/2020 |
| CN | 111155055 A | 5/2020 |
| CN | 111180490 A | 5/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 112928147 A | 6/2020 |
| CN | 210668382 U | 6/2020 |
| CN | 111403621 A | 7/2020 |
| CN | 111524460 A | 8/2020 |
| CN | 111524469 A | 8/2020 |
| CN | 111584725 A | 8/2020 |
| CN | 111584748 A | 8/2020 |
| CN | 111640882 A | 9/2020 |
| CN | 111668240 A | 9/2020 |
| CN | 111682055 A | 9/2020 |
| CN | 111682120 A | 9/2020 |
| CN | 111725288 A | 9/2020 |
| CN | 111739921 A | 10/2020 |
| CN | 111739924 A | 10/2020 |
| CN | 111755493 A | 10/2020 |
| CN | 111755623 A | 10/2020 |
| CN | 111799374 A | 10/2020 |
| CN | 111834547 A | 10/2020 |
| CN | 111862875 A | 10/2020 |
| CN | 111863900 A | 10/2020 |
| CN | 111863911 A | 10/2020 |
| CN | 112054048 A | 12/2020 |
| CN | 112103318 A | 12/2020 |
| CN | 112310325 A | 2/2021 |
| CN | 112382651 A | 2/2021 |
| CN | 112436029 A | 3/2021 |
| CN | 112436030 A | 3/2021 |
| CN | 112436031 A | 3/2021 |
| CN | 112436032 A | 3/2021 |
| CN | 112885976 A | 6/2021 |
| CN | 112952021 A | 6/2021 |
| CN | 113053978 A | 6/2021 |
| CN | 113054133 A | 6/2021 |
| CN | 113054134 A | 6/2021 |
| CN | 113383611 A | 9/2021 |
| EP | 2 998 997 A1 | 3/2016 |
| EP | 3 182 477 A1 | 6/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 3 499 576 A1 | 6/2019 |
| JP | 2006-318910 A | 11/2006 |
| JP | 2007-188854 A | 7/2007 |
| JP | 2007-273261 | 10/2007 |
| JP | 2008-091323 A | 4/2008 |
| JP | 2010-258410 A | 11/2010 |
| JP | 5233074 B2 | 7/2013 |
| JP | 2013-219278 A | 10/2013 |
| KR | 1020100054630 A | 5/2010 |
| KR | 1020100123735 A | 11/2010 |
| KR | 1020140062258 A | 5/2014 |
| KR | 1020150127368 A | 11/2015 |
| KR | 101640772 B1 | 7/2016 |
| KR | 1020170030168 A | 3/2017 |
| KR | 1020170075865 A | 7/2017 |
| KR | 1020180115655 A | 10/2018 |
| KR | 1020180121304 A | 11/2018 |
| KR | 1020210079850 A | 6/2021 |
| KR | 1020210084869 A | 7/2021 |
| TW | 201929219 A | 7/2019 |
| WO | WO-2011/012212 A1 | 2/2011 |
| WO | WO-2011/049284 A1 | 4/2011 |
| WO | WO-2016/056364 A1 | 4/2016 |
| WO | WO-2017/072678 A1 | 5/2017 |
| WO | WO-2018/033860 A1 | 2/2018 |
| WO | WO-2018/206575 A1 | 11/2018 |
| WO | WO-2019/006749 A1 | 1/2019 |
| WO | WO-2019/047126 A1 | 3/2019 |
| WO | WO-2019/062221 A1 | 4/2019 |
| WO | WO-2019/062236 A1 | 4/2019 |
| WO | WO-2019/088594 A2 | 5/2019 |
| WO | WO-2019/141198 A1 | 7/2019 |
| WO | WO-2019/147012 A1 | 8/2019 |
| WO | WO-2019/178782 A1 | 9/2019 |
| WO | WO-2019/199131 A1 | 10/2019 |
| WO | WO-2019/199139 A1 | 10/2019 |
| WO | WO-2019/200862 A1 | 10/2019 |
| WO | WO-2019/233298 A1 | 12/2019 |
| WO | WO-2019/242510 A1 | 12/2019 |
| WO | WO-2020/029559 A1 | 2/2020 |
| WO | WO-2020/029612 A1 | 2/2020 |
| WO | WO-2020/029621 A1 | 2/2020 |
| WO | WO-2020/045262 A1 | 3/2020 |
| WO | WO-2020/052232 A1 | 3/2020 |
| WO | WO-2020/057208 A1 | 3/2020 |
| WO | WO-2020/079456 A1 | 4/2020 |
| WO | WO-2020/105015 A1 | 5/2020 |
| WO | WO-2020/134914 A1 | 7/2020 |
| WO | WO-2020/191889 A1 | 10/2020 |
| WO | WO-2020/192051 A1 | 10/2020 |
| WO | WO-2020/199445 A1 | 10/2020 |
| WO | WO-2020/219267 A1 | 10/2020 |
| WO | WO-2020/221633 A1 | 11/2020 |
| WO | WO-2020/226383 A1 | 11/2020 |
| WO | WO-2020/243740 A1 | 12/2020 |
| WO | WO-2020/261191 A1 | 12/2020 |
| WO | WO-2021/055547 A2 | 3/2021 |
| WO | WO-2021/057012 A1 | 4/2021 |

OTHER PUBLICATIONS

Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.

Aqra, Fathi, and Ahmed Ayyad. "Surface free energy of alkali and transition metal nanoparticles." Applied surface science 314 (2014): 308-313.

Baek, Seungin, et al. "74-2: Diffracted Image Retrieving with Deep Learning."?SID Symposium Digest of Technical Papers. vol. 51. No. 1. 2020.

Bechtolsheim, C. V., V. Zaporojtchenko, and F. Faupel. "Interface structure and formation between gold and trimethylcyclohexane polycarbonate." Journal of materials research 14.9 (1999): 3538-3543.

Chen, Yu-Hung, et al. "58.2: High-Performance Large-Size OLED Tv with Ultra Hd Resolution." SID Symposium Digest of Technical Papers. vol. 46. No. 1. 2015.

Ching, Suet Ying. "Plasmonic properties of silver-based alloy thin films." (2015). Open Access Theses and Dissertations. 194.

Ching, Suet Ying. "Plasmonic properties of silver-based alloy thin films." (2016).

David, Robert, Neumann, A. Wilhelm. "A Theory for the Surface Tensions and Contact Angles of HydrogenBonding Liquids." Langmuir 30.39 (2014):11634-11639.

Dubrovskii, Vladimir. "Fundamentals of Nucleation Theory." Nucleation Theory and Growth of Nanostructures. Springer, Berlin, Heidelberg, 2014. 1-73.

(56) References Cited

OTHER PUBLICATIONS

Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Emerton, Neil, David Ren, and Tim Large. "28-1: Image Capture Through TFT Arrays." SID Symposium Digest of Technical Papers. vol. 51. No. 1. 2020.
Faupel, F., et al. "Nucleation, growth, interdiffusion, and adhesion of metal films on polymers."?AIP Conference Proceedings. vol. 491. No. 1. American Institute of Physics, 1999.
Feng, Zhengyu, et al. "28-3: Pixel Design for Transparent MicroLED Display with Low Blurring."?SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Foreign Action other than Search Report on CN 2020800460386 dated Aug. 18, 2022.
Fowkes, Frederick M. "Attractive Forces at Interfaces." Industrial and Engineering Chemistry 56.12 (1964): 40-52.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34.16 (2001): 5627-5634.
Fusella, Michael A., et al. "Plasmonic enhancement of stability and brightness in organic light-emitting devices." Nature 585.7825 (2020): 379-382.
Heaney, James B. "Evaluation of commercially supplied silver coated Teflon for spacecraft temperature control usage." (1974).
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
International Search Report and Written Opinion on PCT PCT/IB2020/056047 dated Nov. 4, 2020.
Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning."?SID Symposium Digest of Technical Papers. vol. 46. No. 1. 2015.
Kim, Haewon, et al. "Analysis of Semi-Transparent Cathode Performance Based on Fabrication Methods." IDW'19. 2019.
Kim, Hyun-Chang, et al. "39-4: A Method of Panel-Current Limitation for Automotive OLED Displays."?SID Symposium Digest of Technical Papers. vol. 51. No. 1. 2020.
Kim, S.K., et al. "5-4: High Efficiency Top-Emission Organic Light Emitting Diodes Realized Using Newly Developed Low Absorption Pure Ag cathode Configuration" SID Symposium Digest of Technical Papers, 50: 50-53. 2019.

Kisin, Srdjan Adhesion changes at metal-polymer interfaces: Study of the copper-(acrylonitrile-butadiene-styrene) system. Diss. Dissertation, Technische Universiteit Eindhoven, 2007.
Knight Jr, L. B., et al. "Unusual behavior of vaporized magnesium under low pressure conditions" The Journal of Physical Chemistry 79.12 (1975): 1183-1190.
Koma, N. et al. "44.2: Novel Front-light System Using Fine-pitch Patterned OLED." SID Symposium Digest of Technical Papers, 39: 655-658. 2008.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.
Lifka, H et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Lund, L. G., et al. "514. Phosphonitrilic derivatives. Part I. The preparation of cyclic and linear phosphonitrilic chlorides." Journal of the Chemical Society (Resumed) (1960): 2542-2547.
Maissel, Leon I., and Maurice H. Francombe. An introduction to thin films. CRC Press, 1973. pp. 61- 83, 198, 199.
Meinders, Marcel BJ, William Kloek, and Ton van Vliet. "Effect of surface elasticity on Ostwald ripening in emulsions." Langmuir 17.13 (2001): 3923-3929.
Michele Ricks. Advanced OLED Materials Enabling Large-Size OLED Displays by Ink Jet Printing. OLEDs World Summit, Sep. 2020.
Mittal, Kashmiri Lal, ed. Metallized plastics 3: fundamental and applied aspects. Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Murano, Sven, et al. "30.3: Invited Paper: AMOLED Manufacturing-Challenges and Solutions from a Material Makers Perspective." SID Symposium Digest of Technical Papers. vol. 45. No. 1. 2014.
Nakamura, Daiki, et al. "68-4: Top-emission OLED Kawara-type Multidisplay with Auxiliary Electrode." SID Symposium Digest of Technical Papers. vol. 49. No. 1. 2018.
Nittler, Laurent, et al. "Morphology study of small amounts of evaporated gold on polymers." Surface and interface analysis 44.8 (2012): 1072-1075.
Ohring, Milton. Materials science of thin films. Elsevier, 2001.
Okuyama, Kentaro, et al. "79-4L: Late-News Paper: Highly Transparent LCD using New Scattering-type Liquid Crystal with Field Sequential Color Edge Light." SID Symposium Digest of Technical Papers, ?48, 2017.
Pandharkar, Riddhish, et al. "A Computational Study of AlF3 and ACF Surfaces." Inorganics 6.4 (2018): 124.
Park, Chan II, et al. "54-1: Distinguished Paper: World 1st Large Size 77-inch Transparent Flexible OLED Display."?SID Symposium Digest of Technical Papers. vol. 49. No. 1. 2018.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top- Emitting Organic Light-Emitting

(56) References Cited

OTHER PUBLICATIONS

Diodes Employing Mask-Free Plasma Etched Stochastic Polymer Surface." SID Symposium Digest of Technical Papers. vol. 46. No. 1. 2015.

Peters, Richard D., et al. "Using Self-Assembled Monolayers Exposed to X-rays to Control the Wetting Behavior of Thin Films of Diblock Copolymers." Langmuir 16.10 (2000): 4625-4631.

Quan, Wei, et al. "69-2: Transparent Conductive Hybrid Cathode Structure for Top-Emitting Organic Light-Emitting Devices." SID Symposium Digest of Technical Papers. vol. 51. No. 1. 2020.

Rokni-Fard, Mahroo, and Quanmin Guo. "Biased Ostwald ripening in site-selective growth of two-dimensional gold clusters." The Journal of Physical Chemistry C 122.14 (2018): 7801-7805.

Safonov, Alexey I., et al. "Deposition of thin composite films consisting of fluoropolymer and silver nanoparticles having surface plasmon resonance." Thin Solid Films 603 (2016): 313-316.

Satulu, Veronica, et al. "Combining fluorinated polymers with Ag nanoparticles as a route to enhance optical properties of composite materials." Polymers 12.8 (2020): 1640.

Scharnberg, M., et al. "Radiotracer measurements as a sensitive tool for the detection of metal penetration in molecular-based organic electronics." Applied Physics Letters 86.2 (2005): 024104.

Schissel, Paul, and Alvin Warren Czanderna. "Reactions at the silver/polymer interface: a review." Solar Energy Materials 3.1-2 (1980): 225-245.

Schwab, Tobias. Top-Emitting OLEDs: Improvement of the Light Extraction Efficiency and Optimization of Microcavity Effects for White Emission. Diss. Saechsische Landesbibliothek-Staats- und Universitaetsbibliothek Dresden, 2014.

Shen, Mingmin, et al. "Destabilization of Ag nanoislands on Ag (100) by adsorbed sulfur." The Journal of chemical physics 135.15 (2011): 154701.

Shi, Shiming, et al. "56-1: Invited Paper: Research on Commercial Foldable AMOLED and Relevant Technologies." SID Symposium Digest of Technical Papers. vol. 51. No. 1. 2020.

Shin, Dong-Youn, and Inyoung Kim. "Self-patterning of fine metal electrodes by means of the formation of isolated silver nanoclusters embedded in polyaniline." Nanotechnology 20.41 (2009): 415301.

Smithson, Robert LW, Donald J. McClure, and D. Fennell Evans. "Effects of polymer substrate surface energy on nucleation and growth of evaporated gold films." Thin Solid Films 307.1-2 (1997): 110-112.

Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.

Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.

Sonoda, Tohru, et al. "84-1: Invited Paper: 30-inch 4K Rollable OLED Display." SID Symposium Digest of Technical Papers. vol. 51. No. 1. 2020.

Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.

Spelt, J. K., Neumann, A. W. "Solid Surface Tension: The Equation of State Approach and the Theory of Surface Tension Components. Theoretical and Conceptual Considerations." Langmuir 3 (1987): 588-591.

Tang, Quan, et al. "28-2: Study of the Image Blur through FFS LCD Panel Caused by Diffraction for Camera under Panel." SID Symposium Digest of Technical Papers. vol. 51. No. 1. 2020.

Tarasevich, Y. I. "Surface energy of oxides and silicates." Theoretical and Experimental Chemistry 42 (2006): 145-161.

Thran, A., et al. "Condensation coefficients of Ag on polymers." Physical review letters 82.9 (1999): 1903.

Tsai, Yu-Hsiang, et al. "P-202: A Flexible Transparent OLED Display with FlexUPTM Technology." SID Symposium Digest of Technical Papers. vol. 48. No. 1. 2017.

Tsujioka, Tsuyoshi, and Kosuke Tsuji. "Metal-vapor deposition modulation on soft polymer surfaces." Applied Physics Express 5.2 (2012): 021601.

Tsujioka, Tsuyoshi, et al. "Selective metal deposition on photoswitchable molecular surfaces." Journal of the American Chemical Society 130.32 (2008): 10740-10747.

Tsujioka, Tsuyoshi, Rie Takagi, and Takahiro Shiozawa. "Light-controlled metal deposition on photochromic polymer films."? Journal of Materials Chemistry 20.43 (2010): 9623-9627.

Varagnolo, Silvia, et al. "Embedded-grid silver transparent electrodes fabricated by selective metal condensation."?Journal of Materials Chemistry C 8.38 (2020): 13453-13457.

Varagnolo, Silvia, et al. "Selective deposition of silver and copper films by condensation coefficient modulation." Electronic Supplementary Material (ESI) for Materials Horizons. (2020).

Varagnolo, Silvia, et al. "Selective deposition of silver and copper films by condensation coefficient modulation." Materials Horizons 7.1 (2020): 143-148.

Vitos, Levente, et al. "The surface energy of metals." Surface science 411.1-2 (1998): 186-202.

Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.

Wang, Hailiang, et al. "P-132: An Under-Display Camera Optical Structure for Full-Screen LCD."?SID Symposium Digest of Technical Papers. vol. 51. No. 1. 2020.

Wang, Zhibin, et al. "55-1: Invited Paper: Self-Assembled Cathode Patterning in AMOLED for Under-Display Camera." SID Symposium Digest of Technical Papers. vol. 51. No. 1. 2020.

Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.

Weimer, P. K. "Physics of Thin Films, vol. 2.". Academic Press, (1964).

Wolfgang Decker, Vast Films, Ltd. "Pattern Metallization: Selective Deposition of Metals on Polymer Films for Functional Applications" AIMCAL Fall Conference 2005.

Wu, Zhongyuan, et al. "34-2: Distinguished Paper: Development of 55inch 8K AMOLED TV by Inkjet Printing Process." SID Symposium Digest of Technical Papers. vol. 51. No. 1. 2020.

Xu, Hua, et al. "Transparent AMOLED Display Derived by Metal Oxide Thin Film Transistor with Praseodymium Doping." Proceedings of the International Display Workshops vol. 26 (IDW '19). 2019.

Yamada, Toshikazu, et al. "Nanoparticle chemisorption printing technique for conductive silver patterning with submicron resolution." Nature communications 7.1 (2016): 1-9.

Yang, Jun-Yu, et al. "32-3: AMOLED IR Drop Compensation for Channel Length Modulation." SID Symposium Digest of Technical Papers. vol. 51. No. 1. 2020.

Yu, Jun Ho, et al. "64-2: Fabrication of Auxiliary Electrodes using Ag Inkjet Printing for OLED Lighting." SID Symposium Digest of Technical Papers. vol. 49. No. 1. 2018.

Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.

Zaporojtchenko, V., et al. "Controlled growth of nano-size metal clusters on polymers by using VPD method."?Surface science 532 (2003): 300-305.

Zaporojtchenko, V., et al. "Determination of condensation coefficients of metals on polymer surfaces."?Surface science 454 (2000): 412-416.

Zaporojtchenko, V., et al. "Formation of metal-polymer interfaces by metal evaporation: influence of deposition parameters and defects." Microelectronic engineering 50.1-4 (2000): 465-471.

Zaporojtchenko, V., et al. "Metal/polymer interfaces with designed morphologies." Journal of Adhesion Science and Technology 14.3 (2000): 467-490.

(56) References Cited

OTHER PUBLICATIONS

Zeng, Yang, et al. "28-4: Investigation of Moir Interference in Pinhole Matrix Fingerprint on Display Technology." SID Symposium Digest of Technical Papers. vol. 51. No. 1. 2020.

Zhang, Bing, et al. "P-124: A 17.3-inch WQHD Top-Emission Foldable AMOLED Display with Outstanding Optical Performance and Visual Effects." SID Symposium Digest of Technical Papers. vol. 51. No. 1. 2020.

Zhang, Hao, et al. "P-131: A Design of Under-screen Face Recognition based on Screen Miniature Blind Apertures." SID Symposium Digest of Technical Papers. vol. 51. No. 1. 2020.

Zhang, Zhenhua. "74-3: Image Deblurring of Camera Under Display by Deep Learning."?SID Symposium Digest of Technical Papers. vol. 51. No. 1. 2020.

Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.

Zhao, Xuan, et al. "P-233: Late-News-Poster: Color Shift Improvement of AMOLED Device with Color Filter." SID Symposium Digest of Technical Papers. vol. 51. No. 1. 2020.

\* cited by examiner

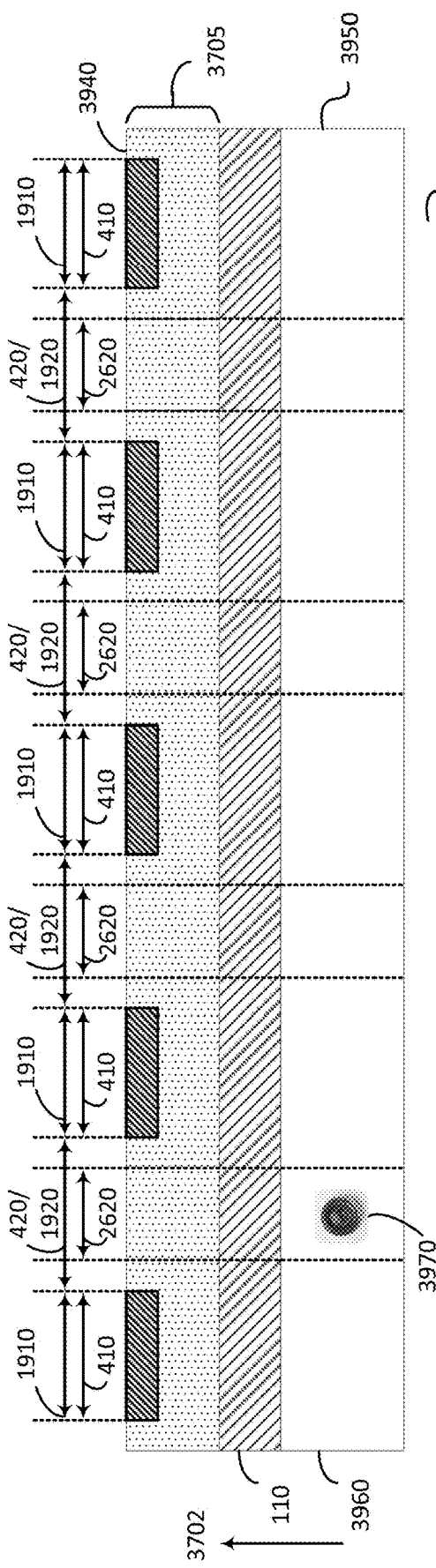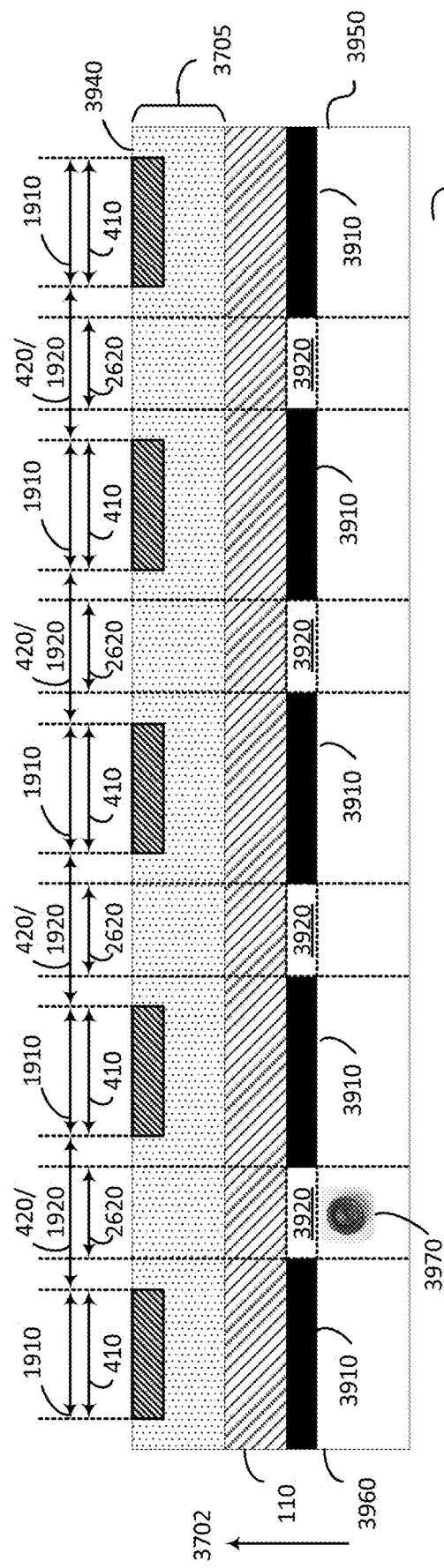
FIG.4A
FIG.4B

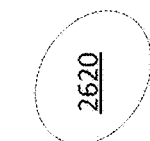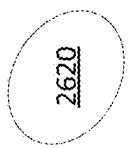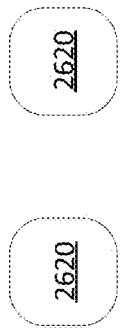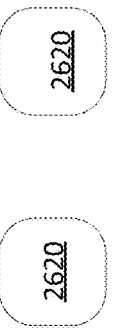
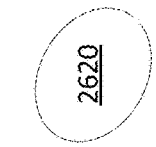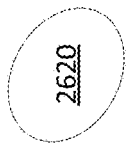
FIG. 5C
FIG. 5F
FIG. 5I
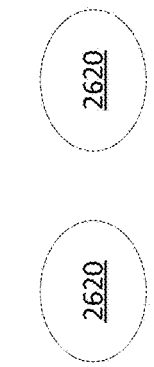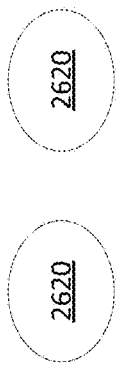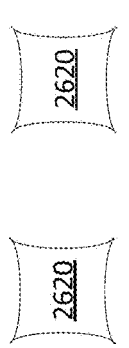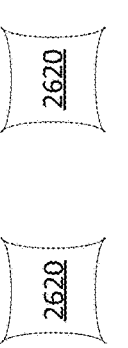
FIG. 5B
FIG. 5E
FIG. 5H
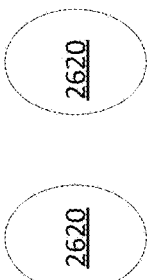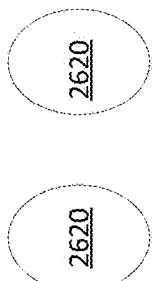
FIG. 5A
FIG. 5D
FIG. 5G

OPTOELECTRONIC DEVICE INCLUDING LIGHT TRANSMISSIVE REGIONS, WITH LIGHT DIFFRACTION CHARACTERISTICS

RELATED APPLICATIONS

The present application is a continuation of U.S. patent application Ser. No. 17/715,896, filed Apr. 7, 2022, which application is a continuation of U.S. patent application Ser. No. 17/622,213, filed Dec. 22, 2021; which application is a 371 National Stage Entry of International Application No. PCT/162020/056047, filed Jun. 25, 2020, which application claims the benefit of priority to U.S. Provisional Patent Application No. 62/867,143 filed Jun. 26, 2019 and U.S. Provisional Patent Application No. 63/011,941 filed Apr. 17, 2020, the contents of each of which are incorporated herein by reference in their entirety.

TECHNICAL FIELD

The present disclosure relates to opto-electronic devices and in particular to an opto-electronic device having light transmissive regions extending therethrough.

BACKGROUND

In an opto-electronic device such as an organic light emitting diode (OLED), at least one semiconducting layer is disposed between a pair of electrodes, such as an anode and a cathode. The anode and cathode are electrically coupled to a power source and respectively generate holes and electrons that migrate toward each other through the at least one semiconducting layer. When a pair of holes and electrons combine, a photon may be emitted.

OLED display panels may comprise a plurality of (sub-) pixels, each of which has an associated pair of electrodes. Various layers and coatings of such panels are typically formed by vacuum-based deposition techniques.

In some applications, it may be desirable to make the device substantially transparent therethrough, while still capable of emitting light therefrom. In some applications, the device comprises a plurality of light transmissive regions extending therethrough.

In some applications, the shape of the boundary of the light transmissive regions may impart a diffraction pattern to the light transmitted therethrough, which may distort the information contained in the transmitted light or otherwise cause interference therewith.

It would be beneficial to provide an improved mechanism for providing transparency through the device while facilitating mitigation of interference by the diffraction pattern.

BRIEF DESCRIPTION OF THE DRAWINGS

Examples of the present disclosure will now be described by reference to the following figures, in which identical reference numerals in different figures indicate identical and/or in some non-limiting examples, analogous and/or corresponding elements and in which:

FIG. 4A is a schematic diagram that show an example cross-sectional view of an example version of the device of FIG. 1 according to an example in the present disclosure;

FIGS. 4B-4F are schematic diagrams that show example cross-sectional views of an example version of the device of FIG. 1 having an opaque coating, according to various examples in the present disclosure;

FIGS. 5A-5I are schematic diagrams illustrating, in plan view, example closed, non-polygonal boundaries of the light transmissive regions, according to an example in the present disclosure;

Figure 1:
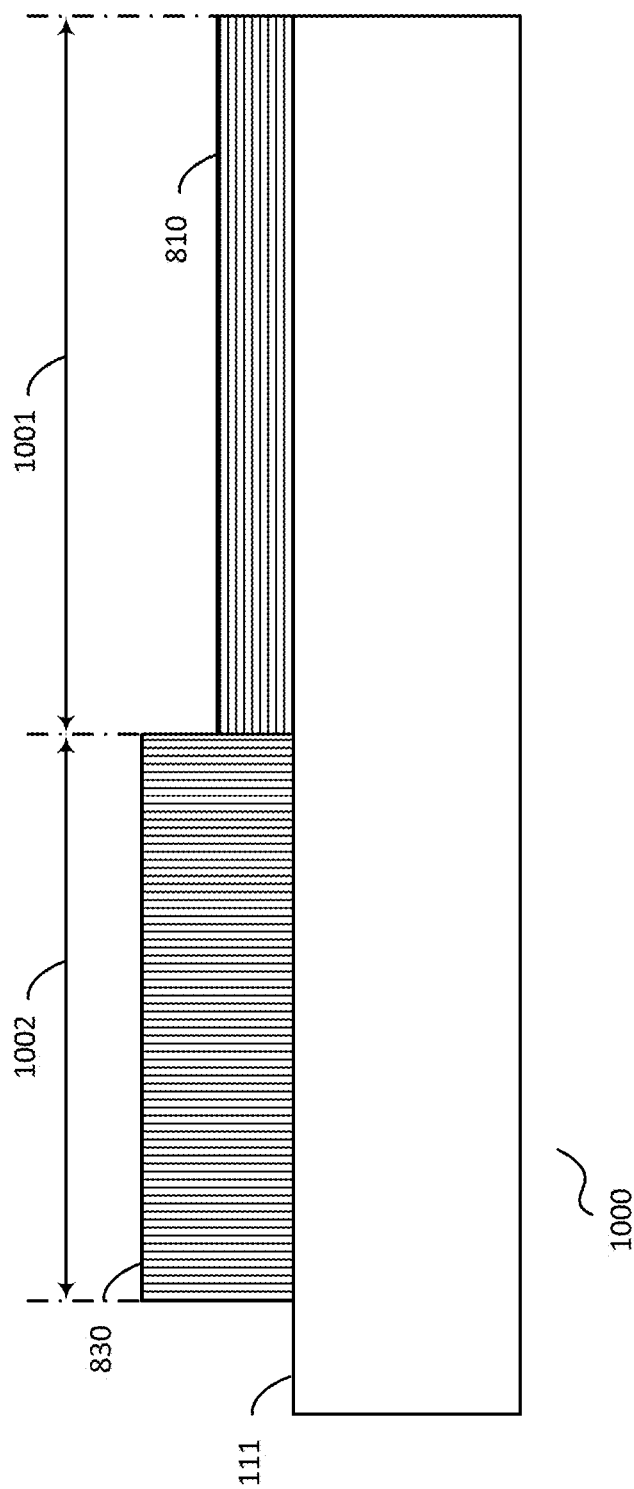
FIG. 1 is a schematic diagram that shows an example cross-sectional view of an example electro-luminescent device with example deposition steps according to an example in the present disclosure.

In the present disclosure, some elements or features may be identified by a reference numeral that may not be shown in any of the figures provided herein.

In the present disclosure, for purposes of explanation and not limitation, specific details are set forth in order to provide a thorough understanding of the present disclosure, including, without limitation, particular architectures, interfaces and/or techniques. In some instances, detailed descriptions of well-known systems, technologies, components, devices, circuits, methods and applications are omitted so as not to obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, so as not to obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses an opto-electronic device that comprises light transmissive regions extending through it along a first axis to allow passage of light therethrough. The transmissive regions may be arranged along a plurality of transverse configuration axes. Emissive regions may lie between adjacent transmissive regions along a plurality of configuration axes to emit light from the device. Each transmissive region has a lateral closed boundary having a shape to alter at least one characteristic of a diffraction pattern, exhibited when light is transmitted through the device, to mitigate interference by such pattern. An opaque coating may comprise at least one aperture defining a corresponding transmissive region to preclude transmission of light therethrough other than through the transmissive region(s). The device can form a face of a user device having a body and housing a transceiver positioned to receive light along at least one light transmissive region.

According to a broad aspect of the present disclosure, there is disclosed an opto-electronic device comprising: a plurality of light transmissive regions, each extending through the device along a first axis, for allowing passage of light therethrough, the light transmissive regions being arranged in a configuration extending along a plurality of configuration axes, each of which is substantially transverse to the first axis; at least one emissive region disposed between adjacent light transmissive regions along a plurality of the configuration axes, for emitting light from the device; each light transmissive region being defined by a closed boundary in a lateral aspect transverse to the first axis that has a shape that alters at least one characteristic of a diffraction pattern exhibited when light is transmitted therethrough to facilitate mitigating interference by such diffraction pattern.

In some non-limiting examples, the boundary may comprise at least one non-linear segment. In some non-limiting examples, the boundary may be substantially elliptical and/or substantially circular.

In some non-limiting examples, the diffraction characteristic may be a number of spikes in the diffraction pattern. In some non-limiting examples, the number of spikes may exceed at least one of 4, 6, 8, 10, 12, 14 and/or 16.

In some non-limiting examples, the diffraction characteristic may be a length of a pattern boundary of the diffraction pattern. In some non-limiting examples, a ratio of a pattern circumference of the diffraction pattern to the length of the pattern boundary of the diffraction pattern may exceed at least one of 0.4, 0.5, 0.6, 0.7, 0.75, 0.8, 0.9 and/or 0.95.

In some non-limiting examples, a light transmittance across the at least one light transmissive region may be substantially the same. In some non-limiting examples, a light transmittance across the at least one light transmissive region may vary by less than at least one of 20%, 15%, 10%, 5%, 2.5% and/or 1%.

In some non-limiting examples, a light transmittance across the plurality of light transmissive regions may be substantially the same. In some non-limiting examples, a light transmittance across the plurality of light transmissive regions may vary by less than at least one of 20%, 15%, 10%, 5%, 2.5% and/or 1%.

In some non-limiting examples, a light transmittance in at least one of the light transmissive regions may exceed at least one of 50%, 60%, 70%, 80% and/or 90%. In some non-limiting examples, a light transmittance therethrough in at least one of the emissive regions is less than about at least one of 50%, 40%, 30%, 20%, 10% and/or 5%.

In some non-limiting examples, the device may substantially preclude transmission of light therethrough other than through the at least one light transmissive region. In some non-limiting examples, the device may further comprise at least one opaque coating, for substantially precluding transmission of light therethrough along the first axis and may have at least one aperture defining a closed boundary of a corresponding at least one light transmissive region. In some non-limiting examples, the opaque coating may be configured to filter light transmitted through the at least one light transmissive region.

In some non-limiting examples, the device may further comprise: at least one first electrode extending in a layer substantially transverse to the first axis and electrically coupled to at least one thin film transistor (TFT), at least one second electrode extending in a layer substantially parallel to the first electrode, and at least one semiconducting layer extending between the at least one first electrode and the at least one second electrode, wherein a stack comprising the at least one first electrode, the at least one second electrode and the at least one semiconducting layer therebetween defines the at least one emissive region.

In some non-limiting examples, the at least one opaque coating may be deposited over the at least one second electrode and may comprise at least one opening to permit light emitted by the at least one emissive region to pass therethrough. In some non-limiting examples, the device may further comprise an encapsulation coating arranged between the at least one second electrode and the at least one opaque coating. In some non-limiting examples, the opaque coating may be deposited on a same layer as the at least one second electrode and may further comprise at least one opening to permit light emitted by the at least one emissive region to pass therethrough.

In some non-limiting examples, the device may further comprise a substrate having a first surface on which the at least one first electrode has been deposited and a second opposed surface. In some non-limiting examples, the opaque coating may be deposited on the first surface of the substrate. In some non-limiting examples, the at least one TFT may be formed between the opaque coating and that at least one first electrode. In some non-limiting examples, the opaque coating may be deposited on the second opposed surface of the substrate. In some non-limiting examples, the opaque coating may be disposed between the at least one emissive region and the substrate.

In some non-limiting examples, the device may further comprise at least one pixel definition layer (PDL) deposited on a perimeter of the at least one first electrode and defining an opening corresponding to the at least one emissive region to permit light emitted thereby to pass therethrough.

In some non-limiting examples, the at least one light transmissive region is substantially devoid of the at least one second electrode.

In some non-limiting examples, the at least one semiconducting layer may extend across the at least one light transmissive region and a patterning coating may be disposed on an exposed surface thereof within the boundary of the at least one light transmissive region, to preclude deposition of a conductive coating thereon to form the at least one second electrode within the at least one light transmissive region. In some non-limiting examples, the boundary of the at least one light transmissive region may be substantially devoid of the PDL.

In some non-limiting examples, a plurality of emissive regions may be disposed between adjacent light transmissive regions. In some non-limiting examples, the plurality of emissive regions may correspond to a pixel and each of the plurality of emissive regions may correspond to a sub-pixel thereof. In some non-limiting examples, each sub-pixel may have an associated color and/or wavelength spectrum. In some non-limiting examples each sub-pixel may correspond to a color that is at least one of red, green, blue and white.

In some non-limiting examples, the plurality of emissive regions may be arranged in a pixel array.

According to a broad aspect of the present disclosure, there is disclosed an electronic device comprising: a layered opto-electronic display defining a face of the device; and a transceiver within the device and positioned to exchange at least one electromagnetic signal across the display; wherein the display comprises: a plurality of light transmissive regions, each extending through the display along a first axis substantially transverse to the face, for allowing passage of light, incident on the face, therethrough, the light transmissive regions being arranged in a configuration extending along a plurality of configuration axes, each of which is substantially transverse to the first axis; at least one emissive region disposed between adjacent light transmissive regions along a plurality of the configuration axes, for emitting light from the display; each light transmissive region being defined by a closed boundary in a lateral aspect transverse to the first axis that has a shape that alters at least one characteristic of a diffraction pattern exhibited when light is transmitted therethrough to facilitate mitigating interference by such diffraction pattern; and the transceiver is positioned within the device to accept light passing through the display along at least one light transmissive region.

According to a broad aspect of the present disclosure, there is disclosed an opto-electronic device comprising: an opaque coating disposed on a first layer surface of the device, comprising at least one aperture having a closed boundary defining a corresponding at least one light transmissive region extending through the device along a first axis transverse to the first layer surface, for allowing passage of light therethrough; wherein each aperture has a shape that alters at least one diffraction characteristic to reduce a diffraction effect exhibited when light is transmitted therethrough to facilitate mitigating interference by such diffraction pattern; and wherein the opaque coating substantially precludes transmission of light therethrough other than through the at least one light transmissive region.

In some non-limiting examples, a light transmittance across the at least one light transmissive region may be substantially the same. In some non-limiting examples, a light transmittance across the at least one light transmissive region may vary by less than at least one of 20%, 15%, 10%, 5%, 2.5% and/or 1%.

In some non-limiting examples, a light transmittance across the plurality of light transmissive regions may be substantially the same. In some non-limiting examples, a light transmittance across the plurality of light transmissive regions may vary by less than at least one of 20%, 15%, 10%, 5%, 2.5% and/or 1%.

In some non-limiting examples, a light transmittance in the at least one light transmissive region may exceed at least one of 50%, 60%, 70%, 80% and/or 90%. In some non-limiting examples, the opaque coating may reduce light transmission therethrough by at least one of 30%, 40%, 50%, 60%, 70%, 80%, 90% and/or 95%.

In some non-limiting examples, the opaque coating may be configured to filter light transmitted through the at least one light transmissive region.

In some non-limiting examples, the light transmissive regions may be aligned in a configuration extending along at least one configuration axis.

In some non-limiting examples, the device may further comprise: at least one first electrode extending in a layer substantially parallel to the first layer surface and electrically coupled to at least one thin film transistor (TFT), at least one second electrode extending in a layer substantially parallel to the first layer surface, and at least one semiconducting layer extending between the at least one first electrode and the at least one second electrode, wherein a stack comprising the at least one first electrode, the at least one second electrode and the at least one semiconducting layer therebetween defines at least one emissive region of the device for emitting light from the device.

In some non-limiting examples, a light transmittance therethrough in at least one of the emissive regions may be less than about at least one of 50%, 40%, 30%, 20%, 10% and/or 5%.

In some non-limiting examples, the opaque coating may be deposited over the at least one second electrode and may further comprise at least one opening to permit light emitted by the at least one emissive region to pass therethrough. In some non-limiting examples, the device may further comprise an encapsulation coating arranged between the at least one second electrode and the opaque coating. In some non-limiting examples, the opaque coating may be deposited on a same layer as the at least one second electrode and may further comprise at least one opening to permit light emitted by the at least one emissive region to pass therethrough.

In some non-limiting examples, the device may further comprise a substrate having a first surface on which the at least one first electrode has been deposited and a second opposed surface. In some non-limiting examples, the opaque coating may be deposited on the first surface of the substrate. In some non-limiting examples, the at least one TFT may be formed between the opaque coating and the at least one first electrode. In some non-limiting examples, the opaque coating may be deposited on the second opposed surface of the substrate. In some non-limiting examples, the opaque coating may be disposed between the at least one emissive region and the substrate.

In some non-limiting examples, the device may further comprise at least one pixel definition layer (PDL) deposited on a perimeter of the at least one first electrode and defining an opening corresponding to the at least one emissive region to permit light emitted thereby to pass therethrough.

In some non-limiting examples, the at least one light transmissive region may be substantially devoid of the at least one second electrode.

In some non-limiting examples, the at least one semiconducting layer may extend across the at least one light transmissive region and a patterning coating may be disposed on an exposed surface thereof within the boundary of the at least one light transmissive region, to preclude deposition of a conductive coating thereon to form the at least one second electrode within the at least one light transmissive region. In some non-limiting examples, the at least one aperture may be substantially devoid of the PDL.

In some non-limiting examples, a plurality of emissive regions may be disposed between adjacent light transmissive regions. In some non-limiting examples, the plurality of emissive regions may correspond to a pixel and each of the plurality of emissive regions may correspond to a sub-pixel thereof. In some non-limiting examples, each sub-pixel may have an associated color and/or wavelength spectrum. In some non-limiting examples, each sub-pixel may correspond to a color that is at least one of red, green, blue and white.

In some non-limiting examples, the plurality of emissive regions may be arranged in a pixel array.

In some non-limiting examples, the boundary may comprise at least one non-linear segment. In some non-limiting examples, the boundary may be substantially elliptical and/or substantially circular.

In some non-limiting examples, the diffraction characteristic may be a number of spikes in the diffraction pattern. In some non-limiting examples, the number of spikes may exceed at least one of 4, 6, 8, 10, 12, 14 and/or 16.

In some non-limiting examples, the diffraction characteristic may be a length of a pattern boundary of the diffraction pattern. In some non-limiting examples, a ratio of a pattern circumference of the diffraction pattern to the length of the pattern boundary of the diffraction pattern may exceed at least one of 0.4, 0.5, 0.6, 0.7, 0.75, 0.8, 0.9 and/or 0.95.

According to a broad aspect of the present disclosure, there is disclosed an electronic device comprising: a layered opto-electronic display defining a face of the device; and a transceiver within the device and positioned to exchange at least one electromagnetic signal across the display; wherein the display comprises: an opaque coating disposed on a first layer surface of the display, comprising at least one aperture having a closed boundary defining a corresponding at least one light transmissive region extending through the device along a first axis transverse to the first layer surface, for allowing passage of light, incident on the face, therethrough; wherein each aperture has a shape that alters at least one diffraction characteristic to reduce a diffraction effect exhibited when light is transmitted therethrough to facilitate mitigating interference by such diffraction pattern; and wherein the opaque coating substantially precludes transmission of light therethrough other than through the at least one light transmissive region; and the transceiver is positioned within the device to accept light passing through the display along at least one light transmissive region.

Examples have been described above in conjunctions with aspects of the present disclosure upon which they can be implemented. Those skilled in the art will appreciate that examples may be implemented in conjunction with the aspect with which they are described, but may also be implemented with other examples of that or another aspect. When examples are mutually exclusive, or are otherwise incompatible with each other, it will be apparent to those having ordinary skill in the relevant art. Some examples may be described in relation to one aspect, but may also be applicable to other aspects, as will be apparent to those having ordinary skill in the relevant art.

Some aspects or examples of the present disclosure may provide an opto-electronic device having light transmissive regions through it defined by apertures, in an opaque coating, that have a non-polygonal shaped closed boundary to facilitate mitigation of interference from diffraction caused by the shape of the closed boundary.

DESCRIPTION

Opto-Electronic Device

The present disclosure relates generally to electronic devices, and more specifically, to opto-electronic devices. An opto-electronic device generally encompasses any device that converts electrical signals into photons and vice versa.

In the present disclosure, the terms "photon" and "light" may be used interchangeably to refer to similar concepts. In the present disclosure, photons may have a wavelength that lies in the visible light spectrum, in the infrared (IR) and/or ultraviolet (UV) region thereof. Additionally, the term "light" may refer generally to any electromagnetic signal, whether or not having an associated wavelength spectrum that is generally understood to correspond to that of visible light, and may include, in some non-limiting examples, depending upon context, a signal that lies in the UV, IR and/or near-IR wavelength regions.

An organic opto-electronic device can encompass any opto-electronic device where one or more active layers and/or strata thereof are formed primarily of an organic (carbon-containing) material, and more specifically, an organic semiconductor material.

In the present disclosure, it will be appreciated by those having ordinary skill in the relevant art that an organic material, may comprise, without limitation, a wide variety of organic molecules, and/or organic polymers. Further, it will be appreciated by those having ordinary skill in the relevant art that organic materials that are doped with various inorganic substances, including without limitation, elements and/or inorganic compounds, may still be considered to be organic materials. Still further, it will be appreciated by those having ordinary skill in the relevant art that various organic materials may be used, and that the processes described herein are generally applicable to an entire range of such organic materials.

In the present disclosure, an inorganic substance may refer to a substance that primarily includes an inorganic material. In the present disclosure, an inorganic material may comprise any material that is not considered to be an organic material, including without limitation, metals, glasses and/or minerals.

Where the opto-electronic device emits photons through a luminescent process, the device may be considered an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor and/or a television set (collectively "user device" 3950 (FIG. 4A)).

In some non-limiting examples, the opto-electronic device may be an organic photo-voltaic (OPV) device that converts photons into electricity. In some non-limiting examples, the opto-electronic device may be an electro-luminescent quantum dot device. In the present disclosure, unless specifically indicated to the contrary, reference will be made to OLED devices, with the understanding that such disclosure could, in some examples, equally be made applicable to other opto-electronic devices, including without limitation, an OPV and/or quantum dot device in a manner apparent to those having ordinary skill in the relevant art.

The structure of such devices will be described from each of two aspects, namely from a cross-sectional aspect and/or from a lateral (plan view) aspect.

In the present disclosure, the terms "layer" and "strata" may be used interchangeably to refer to similar concepts.

In the context of introducing the cross-sectional aspect below, the components of such devices are shown in substantially planar lateral strata. Those having ordinary skill in the relevant art will appreciate that such substantially planar representation is for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device is shown below in its cross-sectional aspect as a substantially stratified structure, in the plan view aspect discussed below, such device may illustrate a diverse topography to define features, each of which may substantially exhibit the stratified profile discussed in the cross-sectional aspect.

Those having ordinary skill in the relevant art will appreciate that when a component, a layer, a region and/or portion thereof is referred to as being "formed", "disposed" and/or "deposited" on another underlying material, component, layer, region and/or portion, such formation, disposition and/or deposition may be directly and/or indirectly on an exposed layer surface 111 (at the time of such formation, disposition and/or deposition) of such underlying material, component, layer, region and/or portion, with the potential of intervening material(s), component(s), layer(s), region(s) and/or portion(s) therebetween.

In the present disclosure, a directional convention is followed, extending substantially normally relative to the lateral aspect described above, in which the substrate 110 (FIG. 3) is considered to be the "bottom" of the device 1000 (FIG. 1), and the layers 120 (FIG. 3), 130 (FIG. 3), 140 (FIG. 3) are disposed on "top" of the substrate 110. Following such convention, the second electrode 140 is at the top of the device 1000 shown, even if (as may be the case in some examples, including without limitation, during a manufacturing process, in which one or more layers 120, 130, 140 may be introduced by means of a vapor deposition process), the substrate 110 is physically inverted such that the top surface, on which one of the layers 120, 130, 140, such as, without limitation, the first electrode 120, is to be disposed, is physically below the substrate 110, so as to allow the deposition material (not shown) to move upward and be deposited upon the top surface thereof as a thin film.

In some non-limiting examples, the device 1000 may be electrically coupled to a power source (not shown). When so coupled, the device 1000 may emit photons as described herein.

Thin Film Formation

The layers 120, 130, 140 may be disposed in turn on a target exposed layer surface 111 (FIG. 1) (and/or, in some non-limiting examples, including without limitation, in the case of selective deposition disclosed herein, at least one target region and/or portion of such surface) of an underlying material, which in some non-limiting examples, may be, from time to time, the substrate 110 and intervening lower layers 120, 130, 140, as a thin film. In some non-limiting examples, an electrode 120, 140, 1750 (FIG. 3) may be formed of at least one thin conductive film layer of a conductive coating 830 (FIG. 1).

The thickness of each layer, including without limitation, layers 120, 130, 140, and of the substrate 110, shown throughout the figures, is illustrative only and not necessarily representative of a thickness relative to another layer 120, 130, 140 (and/or of the substrate 110).

The formation of thin films during vapor deposition on an exposed layer surface 111 of an underlying material involves processes of nucleation and growth. During initial stages of film formation, a sufficient number of vapor monomers (which in some non-limiting examples may be molecules and/or atoms) typically condense from a vapor phase to form initial nuclei on the surface 111 presented, whether of the substrate 110 (or of an intervening lower layer 120, 130, 140). As vapor monomers continue to impinge on such surface, a size and density of these initial nuclei increase to form small clusters or islands. After reaching a saturation island density, adjacent islands typically will start to coalesce, increasing an average island size, while decreasing an island density. Coalescence of adjacent islands may continue until a substantially closed film is formed.

While the present disclosure discusses thin film formation, in reference to at least one layer or coating, in terms of vapor deposition, those having ordinary skill in the relevant art will appreciate that, in some non-limiting examples, various components of the electro-luminescent device 100 may be selectively deposited using a wide variety of techniques, including without limitation, evaporation (including without limitation, thermal evaporation and/or electron beam evaporation), photolithography, printing (including without limitation, ink jet and/or vapor jet printing, reel-to-reel printing and/or micro-contact transfer printing), physical vapor deposition (PVD) (including without limitation, sputtering), chemical vapor deposition (CVD) (including without limitation, plasma-enhanced CVD (PECVD) and/or organic vapor phase deposition (OVPD)), laser annealing, laser-induced thermal imaging (LITI) patterning, atomic-layer deposition (ALD), coating (including without limitation, spin coating, dip coating, line coating and/or spray coating) and/or combinations thereof. Some processes may be used in combination with a shadow mask, which may, in some non-limiting examples, be an open mask and/or fine metal mask (FMM), during deposition of any of various layers and/or coatings to achieve various patterns by masking and/or precluding deposition of a deposited material on certain parts of a surface of an underlying material exposed thereto.

In the present disclosure, the terms "evaporation" and/or "sublimation" may be used interchangeably to refer generally to deposition processes in which a source material is converted into a vapor, including without limitation by heating, to be deposited onto a target surface in, without limitation, a solid state. As will be understood, an evaporation process is a type of PVD process where one or more source materials are evaporated and/or sublimed under a low pressure (including without limitation, a vacuum) environment and deposited on a target surface through de-sublimation of the one or more evaporated source materials. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source) and/or any other type of evaporation source.

In the present disclosure, a reference to a layer thickness of a material, irrespective of the mechanism of deposition thereof, refers to an amount of the material deposited on a target exposed layer surface 111, which corresponds to an amount of the material to cover the target surface with a uniformly thick layer of the material having the referenced layer thickness. By way of non-limiting example, depositing a layer thickness of 10 nanometers (nm) of material indicates that an amount of the material deposited on the surface corresponds to an amount of the material to form a uniformly thick layer of the material that is 10 nm thick. It will be appreciated that, having regard to the mechanism by which thin films are formed discussed above, by way of non-limiting example, due to possible stacking or clustering of monomers, an actual thickness of the deposited material may be non-uniform. By way of non-limiting example, depositing a layer thickness of 10 nm may yield some parts of the deposited material having an actual thickness greater than 10 nm, or other parts of the deposited material having an actual thickness less than 10 nm. A certain layer thickness of a material deposited on a surface may thus correspond, in some non-limiting examples, to an average thickness of the deposited material across the target surface.

In the present disclosure, a target surface (and/or target region(s) thereof) may be considered to be "substantially devoid of", "substantially free of" and/or "substantially uncovered by" a material if there is a substantial absence of the material on the target surface as determined by any suitable determination mechanism.

In the present disclosure, for purposes of simplicity of illustration, details of deposited materials, including without limitation, thickness profiles and/or edge profiles of layer(s) have been omitted.

Lateral Aspect

In some non-limiting examples, including where the OLED device 3700 (FIG. 2) comprises a display module, the lateral aspect of the device 3700 may be sub-divided into a plurality of emissive regions 1910 (FIG. 3) of the device 3700, in which the cross-sectional aspect of the device structure 3700, within each of the emissive region(s) 1910, causes photons to be emitted therefrom when energized.

Figure 2:
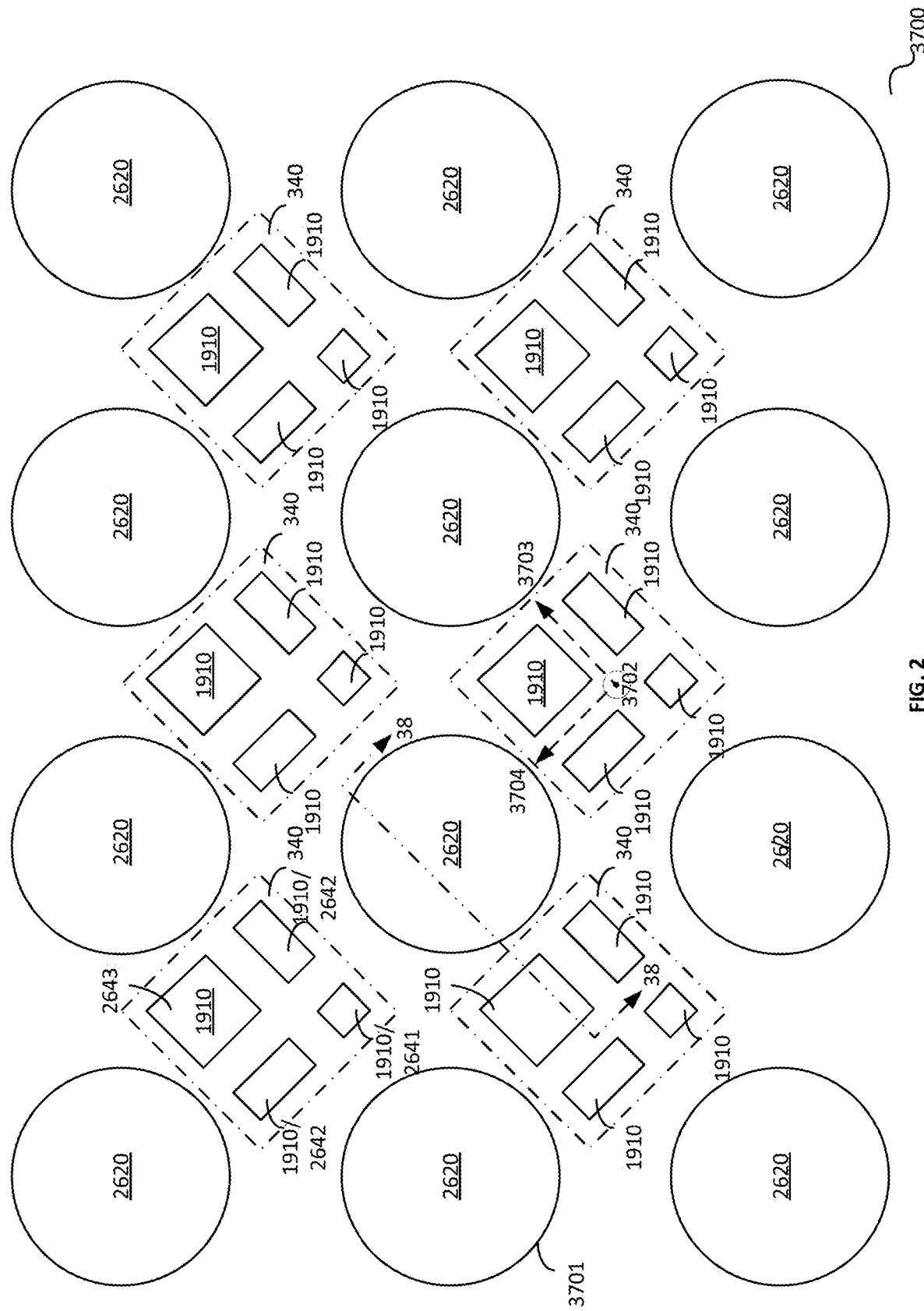
FIG. 2 is a schematic diagram illustrating, in plan view, an example of a transparent electro-luminescent device, having a plurality of emissive regions and a plurality of light transmissive regions, arranged in a two-dimensional array formation, according to an example in the present disclosure.

In some non-limiting examples, each emissive region 1910 of the device 3700 corresponds to a single display pixel 340 (FIG. 2). In some non-limiting examples, each pixel 340 emits light at a given wavelength spectrum. In some non-limiting examples, the wavelength spectrum corresponds to a colour in, without limitation, the visible light spectrum.

In some non-limiting examples, each emissive region 1910 of the device 3700 corresponds to a sub-pixel 2641-2643 (FIG. 2) of a display pixel 340. In some non-limiting examples, a plurality of sub-pixels 2641-2643 may combine to form, or to represent, a single display pixel 340.

In the present disclosure, the concept of a sub-pixel 2641-2643 may be referenced herein, for simplicity of description only, as a sub-pixel 264x. Likewise, in the present disclosure, the concept of a pixel 340 may be discussed in conjunction with the concept of at least one sub-pixel 264x thereof. For simplicity of description only, such composite concept is referenced herein as a "(sub-)pixel 340/264x" and such term is understood to suggest either or both of a pixel 340 and/or at least one sub-pixel 264x thereof, unless the context dictates otherwise.

Non-Emissive Regions

Figure 3:
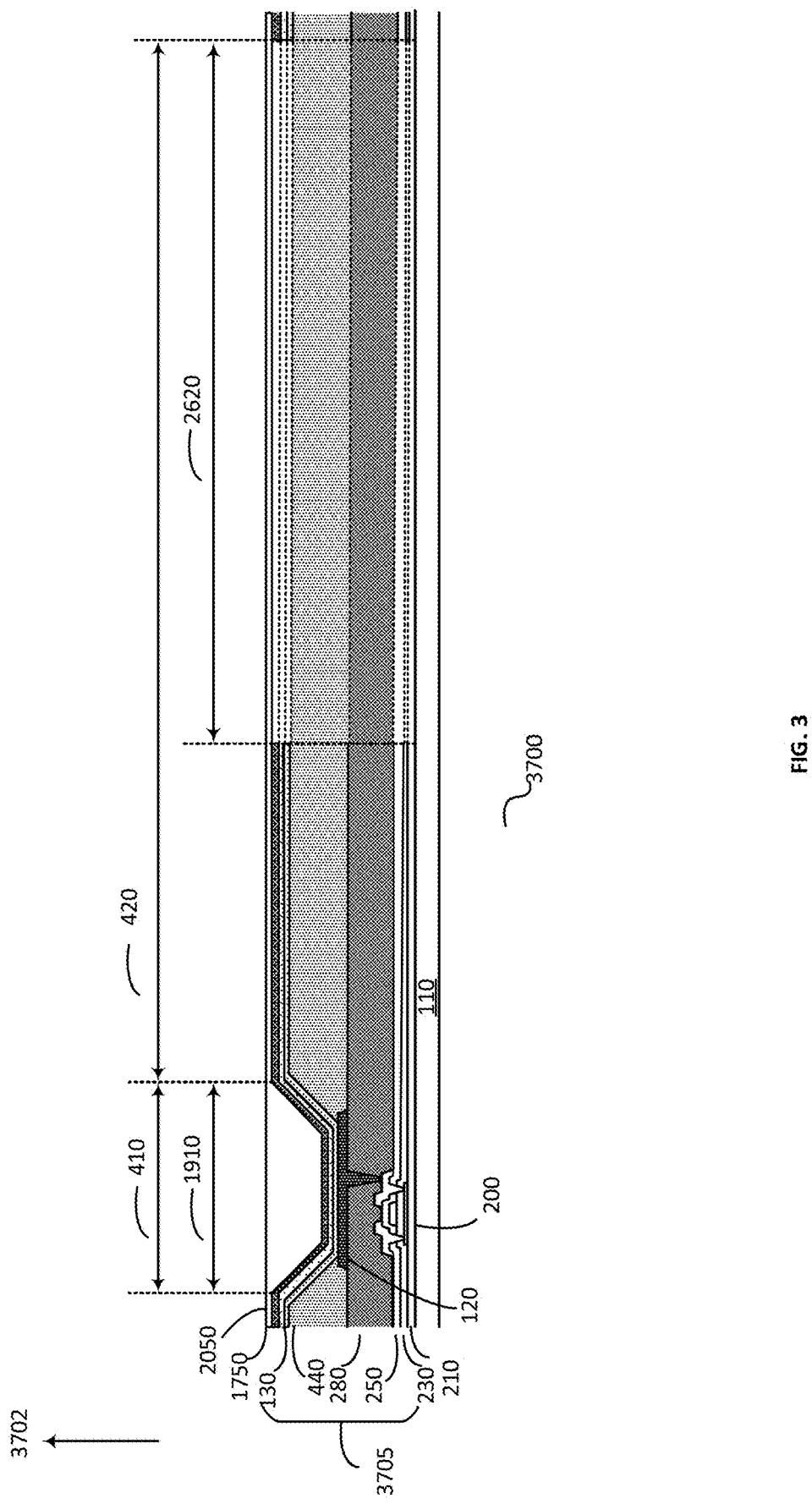
FIG. 3 is a schematic diagram that shows an example cross-sectional view of an example version of the device of FIG. 1 respectively taken along lines 3B-3B.

In some non-limiting examples, the various emissive regions 1910 of the device 3700 are substantially surrounded and separated by, in at least one lateral direction, one or more non-emissive regions 1920, in which the structure and/or configuration along the cross-sectional aspect, of the device structure 3700 shown, without limitation, in FIG. 3, is varied, so as to substantially inhibit photons to be emitted therefrom. In some non-limiting examples, the non-emissive regions 1920 comprise those regions in the lateral aspect, that are substantially devoid of an emissive region 1910.

Thus, the lateral topology of the various layers of the at least one semiconducting layer 130 may be varied to define at least one emissive region 1910, surrounded (at least in one lateral direction) by at least one non-emissive region 1920.

In some non-limiting examples, the emissive region 1910 corresponding to a single display (sub-) pixel 340/264x may be understood to have a lateral aspect 410, surrounded in at least one lateral direction by at least one non-emissive region 1920 having a lateral aspect 420.

Transmissivity

In some non-limiting examples, it may be desirable to make either or both of the first electrode 120 and/or the second electrode 140 substantially photon-(or light)-transmissive ("transmissive"), in some non-limiting examples, at least across a substantial part of the lateral aspect 410 of the emissive region(s) 1910 of the device 3700. In the present disclosure, such a transmissive element, including without limitation, an electrode 120, 140, a material from which such element is formed, and/or property of thereof, may comprise an element, material and/or property thereof that is substantially transmissive ("transparent"), and/or, in some non-limiting examples, partially transmissive ("semi-transparent"), in some non-limiting examples, in at least one wavelength range.

In some non-limiting examples, a mechanism to make the first electrode 120, and/or the second electrode 140 transmissive is to form such electrode 120, 140 of a transmissive thin film.

Nucleation-Inhibiting and/or Promoting Material Properties

In some non-limiting examples, a conductive coating 830 (FIG. 1), that may be employed as, or as at least one of a plurality of layers of thin conductive films to form a device feature, including without limitation, at least one of the first electrode 120, the first electrode 140, an auxiliary electrode 1750 and/or a conductive element electrically coupled thereto, may exhibit a relatively low affinity towards being deposited on an exposed layer surface 111 of an underlying material, so that the deposition of the conductive coating 830 is inhibited.

The relative affinity or lack thereof of a material and/or a property thereof to having a conductive coating 830 deposited thereon may be referred to as being "nucleation-promoting" or "nucleation-inhibiting" respectively.

In the present disclosure, "nucleation-inhibiting" refers to a coating, material and/or a layer thereof that has a surface that exhibits a relatively low affinity for (deposition of) a conductive coating 830 thereon, such that the deposition of the conductive coating 830 on such surface is inhibited.

In the present disclosure, "nucleation-promoting" refers to a coating, material and/or a layer thereof that has a surface that exhibits a relatively high affinity for (deposition of) a conductive coating 830 thereon, such that the deposition of the conductive coating 830 on such surface is facilitated.

The term "nucleation" in these terms references the nucleation stage of a thin film formation process, in which monomers in a vapor phase condense onto the surface to form nuclei.

In the present disclosure, the terms "NIC" and "patterning coating" may be used interchangeably to refer to similar concepts, and references to an NIC 810 (FIG. 1) herein, in the context of being selectively deposited to pattern a conductive coating 830 may, in some non-limiting examples, be applicable to a patterning coating in the context of selective deposition thereof to pattern an electrode coating. In some non-limiting examples, reference to a patterning coating may signify a coating having a specific composition. In some non-limiting examples, a patterning coating, including without limitation, an NIC 810, may be used to selectively deposit a coating that is not electrically conductive, including without limitation, an optical coating that enhances and/or substantially precludes transmission of light therethrough, but in a manner similar to that described in FIG. 1 herein.

In the present disclosure, the terms "conductive coating" and "electrode coating" may be used interchangeably to refer to similar concepts and references to a conductive coating 830 herein, in the context of being patterned by selected deposition of an NIC 810 may, in some non-limiting examples, be applicable to an electrode coating in the context of being patterned by selective deposition of a patterning coating. In some non-limiting examples, reference to an electrode coating may signify a coating having a specific composition.

Turning now to FIG. 1, there is shown an example electro-luminescent device 1000 with a number of additional deposition steps that are described herein.

The device 1000 shows a lateral aspect of the exposed layer surface 111 of the underlying material. The lateral aspect comprises a first portion 1001 and a second portion 1002. In the first portion 1001, an NIC 810 is disposed on the exposed layer surface 111. However, in the second portion 1002, the exposed layer surface 111 is substantially devoid of the NIC 810.

After selective deposition of the NIC 810 across the first portion 1001, the conductive coating 830 is deposited over the device 1000, in some non-limiting examples, using an open mask and/or a mask-free deposition process, but remains substantially only within the second portion 1002, which is substantially devoid of NIC 810.

The NIC 810 provides, within the first portion 1001, a surface with a relatively low initial sticking probability $S_0$, for the conductive coating 830, and that is substantially less than the initial sticking probability $S_0$, for the conductive coating 830, of the exposed layer surface 111 of the underlying material of the device 1000 within the second portion 1002.

Thus, the first portion 1001 is substantially devoid of the conductive coating 830.

In this fashion, the NIC 810 may be selectively deposited, including using a shadow mask, to allow the conductive coating 830 to be deposited, including without limitation, using an open mask and/or a mask-free deposition process, so as to form a device feature, including without limitation, at least one of the first electrode 120, the second electrode 140, the auxiliary electrode 1750 and/or at least one layer thereof, and/or a conductive element electrically coupled thereto.

Diffraction Reduction

In some non-limiting examples, the electro-luminescent device 3700 may form a face 3940 (FIG. 4A) of a user device 3950 that houses at least one transceiver 3970 (FIG. 4A) therewithin for exchanging at least one electromagnetic signal ("light") through the face 3940 of the user device 3950. In some non-limiting examples, the at least one electromagnetic signal passing through the face 3940 of the user device 3950 to and/or from the transceiver 3970 may have a wavelength spectrum that lies, without limitation, in the visible light spectrum, in the IR spectrum, the near-IR spectrum and/or the UV spectrum.

In some non-limiting examples, such transceiver 3970 may comprise a receiver adapted to receive and process light passing through the face 3940 from beyond the user device 3950. Non-limiting examples of such transceiver 3970 may be an under-display camera and/or a sensor, including without limitation, a fingerprint sensor, an optical sensor, an infrared proximity sensor, an iris recognition sensor and/or a facial recognition sensor.

In some non-limiting examples, such transceiver 3970 may also emit light passing through the face 3940 beyond the user device 3950. Non-limiting examples of such transceiver 3970 may be a fingerprint sensor, an infrared proximity sensor and/or a facial recognition sensor, in which such emitted light may be reflected off a surface and return through the face 3940 to be received by the transceiver 3970. In some non-limiting examples, the transceiver 3970 may not emit light, but rather, the electro-luminescent device 100 forming the face 3940 of the user device 3950 may emit the light that is reflected off the surface and returned through the face 3940 to be received by the transceiver 3970 and/or the light that is returned through the face 3940 to be received by the transceiver 3970 is not emitted at all by the user device 3950, but rather constitutes ambient light incident thereon.

To accommodate such transceiver 3970 within the user device 3950, the electro-luminescent device 100 serving as a face 3940 of the user device 3950 may include substantially light transmissive regions to allow the passage of light to pass entirely therethrough, whether from beyond the user device 3950 to within the user device 3950, or vice versa.

Those having ordinary skill in the relevant art will appreciate that, although not shown in the figure, in some non-limiting examples, the transceiver 3970 may have a size that is greater than a single light transmissive region 2620. In some non-limiting examples, the transceiver 3970 may be of a size so as to underlie not only a plurality of light transmissive regions 2620 and/or a plurality of emissive regions 1910 extending therebetween. In such examples, the transceiver 3970 may be positioned under such plurality of light transmissive regions 2620 and may exchange light passing through the face 3940 through such plurality of light transmissive regions 2620.

A non-limiting example is the substantially light transmissive electro-luminescent device 3700 shown in plan in the example schematic diagram of FIG. 2. The device 3700 comprises a plurality of light transmissive regions 2620, each being defined, within a lateral aspect 420 of non-emissive region(s) 1920 defined by the surface of the device 3700, by a closed boundary and/or perimeter 3701.

The light transmissive regions 2620 are configured to allow light to pass through the device 3700 along a first axis 3702 that is substantially transverse to the surface of the device 3700, which in some non-limiting examples, may be parallel to the face 3940 of the user device 3950.

In some non-limiting examples, the light transmittance across each light transmissive region 2620 is substantially the same. In some non-limiting examples, the light transmittance in each light transmissive region 2620 is greater than about 50%, greater than about 60%, greater than about 70%, greater than about 80%, and/or greater than about 90%.

In some non-limiting examples, the light transmittance across each of the plurality of light transmissive regions 2620 and/or a subset thereof, is substantially the same. In some non-limiting examples, the light transmittance across each of the plurality of light transmissive regions 2620 and/or a subset thereof, is greater than about 50%, greater than about 60%, greater than about 70%, greater than about 80%, and/or greater than about 90%.

By way of non-limiting examples, the light transmissive regions 2620 may be configured to transmit light in the visible range, near-IR range and/or IR range of the electromagnetic spectrum. In some non-limiting examples, wavelengths in the IR range of the electromagnetic spectrum may extend between about 700 nm and about 1 mm, between about 750 nm and about 5000 nm, between about 750 nm and about 3000 nm, between about 750 nm and about 1400 nm, and/or between about 850 nm and about 1200 nm.

In some non-limiting examples, the light transmittance of the electro-luminescent device 3700 in the light transmissive region(s) 2620 may be greater than about 50%, greater than about 60%, greater than about 65%, greater than about 70%, greater than about 75%, greater than about 80%, greater than about 85%, greater than about 90% and/or greater than about 95%, for wavelengths in a range of the electromagnetic spectrum of between about 400 nm and about 1400 nm, between about 420 nm and about 1200 nm, and/or between about 430 nm and about 1100 nm.

It has been discovered that, in some non-limiting examples, external light incident on an opto-luminescent device 3700 and transmitted therethrough may be impacted by a diffraction characteristic of a diffraction pattern imposed by the shape of the aperture 3920 (FIG. 4B) through which such light is transmitted therethrough.

At least in some non-limiting examples, electro-luminescent devices 3700 that cause external light that is incident thereon to pass through apertures 3920 therein that are shaped to exhibit a distinctive and non-uniform diffraction pattern, may detrimentally interfere with the capture of an image and/or light pattern represented thereby.

By way of non-limiting example, such diffraction pattern may impede an ability to facilitate mitigating interference by such diffraction pattern, that is, to permit an optical sensor within a user device 3950 to be able to accurately receive and process such image and/or light pattern, even with the application of optical post-processing techniques or to allow a viewer of such image and/or light pattern through such device to discern information contained in such image and/or light pattern.

In the device 3700, the light transmissive regions 2620 are arranged in a substantially planar configuration defined by a plurality of configuration axes 3703, 3704, that are each substantially transverse to the first axis 3702, that is, they lie in the plane defined by the surface of the device 3700.

In some non-limiting examples, the configuration is an array is defined by at least two configuration axes, as shown in FIG. 2, respectively designated 3703 and 3704. In some non-limiting examples, the configuration axes 3703, 3704 are substantially normal to one another and to the first axis 3702.

At least one emissive region 1910 is disposed between adjacent light transmissive regions 2620 along a plurality of the configuration axes 3703, 3704.

As shown, the emissive regions 1910 and the light transmissive regions 2620 extend along each of such configuration axes 3703, 3704 in an alternating pattern. In some non-limiting examples, such alternating pattern is the same along each of such configuration axes 3703, 3704. In some non-limiting examples, such alternating pattern comprises a plurality of emissive regions 1910 between adjacent, neighbouring and/or consecutive light transmissive regions 2620. In some non-limiting examples, such alternating pattern(s) may be repeated substantially identically across the entire device 3700 or, in some non-limiting examples, a portion thereof.

That is, in some non-limiting examples, the alternating pattern(s) may comprise single pixels 340 (each comprising at least one emissive region 1910 each corresponding to a single sub-pixel 264x thereof) alternating with single light transmissive regions 2620.

In some non-limiting examples, each such pixel 340 comprises one, two, three, four, five or more emissive regions 1910 each corresponding to a single sub-pixel 264x thereof. In some non-limiting examples, each sub-pixel 264x is configured to emit light at a given color and/or wavelength spectrum.

In some non-limiting examples, the emissive region(s) 1910 corresponding to each such pixel 340, are arranged in a pixel array between neighbouring light transmissive regions 2620. In some non-limiting examples, such pixel array of emissive regions 1910 are defined by at least one axis that is parallel to at least one of the configuration axes 3703, 3704 along which the alternating pattern(s) extend(s).

In some non-limiting examples, each such pixel 340 comprises four sub-pixels 264x. In some non-limiting examples, the four sub-pixels 264x correspond to one sub-pixel 2641 configured to emit R(ed) light, two sub-pixels 2642 configured to emit G(reen) light and one sub-pixel 2643 configured to emit B(lue) light. In some non-limiting examples, the four sub-pixels 264x correspond to one sub-pixel 2641 configured to emit R(ed) light, one sub-pixel 2642 configured to emit G(reen) light, one sub-pixel 2643 configured to emit B(lue) light and one sub-pixel 264x configured to emit W(hite) light.

In some non-limiting examples, especially when each pixel 340 comprises a plurality of sub-pixels 264x that is a number other than two or four, the sub-pixels 264x of each such pixel 340 may be organized in a polygonal, circular and/or other configuration.

In some non-limiting examples, whether the sub-pixels 264x of a given pixel 340 are organized in an array or other configuration, such configuration may be the same for each pixel 340. In some non-limiting examples, such configuration may be similar in shape for different pixels 340, differing only in the order of sub-pixels 264x thereof. In some non-limiting examples, such configuration may be similar in shape for different pixels 340, differing only in the orientation of such configuration. In some non-limiting examples, such configuration may be different for different pixels 340.

In some non-limiting examples, the size and/or shape of sub-pixels 264x configured to emit light of a given wavelength spectrum may be the same or different. In some non-limiting examples, the size and/or shape of sub-pixels 264x configured to emit light of the same wavelength spectrum may be the same or different. In some non-limiting examples, the shape of such sub-pixels 264x may have a polygonal, circular and/or other shape.

In some non-limiting examples, the transmittance of external light incident on emissive regions 1910 entirely through the device 3700, may be less than about 50%, less than about 40%, less than about 30%, less than about 20%, less than about 10% and/or less than about 5%.

Turning now to FIG. 3, there is shown a cross-sectional view of the device 3700 taken along line 38-38. The emissive region 1910 of a sub-pixel 264x comprises a first electrode 120 coupled to one or more electronic and/or opto-electronic components, including without limitation, thin film transistor (TFT) transistors, resistors and/or capacitors (collectively TFT structure 200), at least one semiconducting layer 130 (or "organic layer" since such layers may comprise organic semiconducting materials) that may comprise a plurality of layers, any of which may be disposed, in some non-limiting examples, in a thin film, in a stacked configuration, which may include, without limitation, any one or more of a hole injection layer (HIL), a hole transport layer (HTL), an emissive layer (EML), an electron transport layer (ETL) and/or an electron injection layer (EIL), disposed over the first electrode 120 and a second electrode 140 disposed over the at least one semiconducting layer 130. The device 3700 further comprises a PDL 440 covering at least a perimeter of the first electrode 120. The PDL 440 defines an opening corresponding to the emissive region 1910 of the sub-pixel 264x. The device 3700 further comprises a substrate 110 upon which the TFT structure 200 is disposed. A TFT insulating layer 280 is provided over the TFT structure 200 and the first electrode 120 is deposited on the TFT insulating layer 280 and configured to be electrically coupled with the TFT structure 200.

In some non-limiting examples, the first electrode 120 may be an anode 341 and the second electrode 140 may be a cathode 342.

In some non-limiting examples, the device 3700 is top-emitting, such that the second electrode 140 is transmissive and in some non-limiting examples, the first electrode 120 is reflective, so as to allow light emitted in the at least one semiconducting layer 130 to be transmitted through the second electrode 140 and away from the substrate 110.

In some non-limiting examples, the device 3700 is bottom-emitting.

In some non-limiting examples, the device 3700 comprises an auxiliary layer disposed on the second electrode 140. In some non-limiting examples, an encapsulation layer, which in some non-limiting examples may be a TFE layer 2050, is provided over the auxiliary layer.

In some non-limiting examples, the layers comprising the TFT structure 200, the TFT insulating layer 280, the first electrode 120, the PDL 440, the at least one semiconducting layer 130, the second electrode 140, the auxiliary layer, and the encapsulation layer may make up a device region 3705 of the device 3700. Although not shown, in some non-limiting examples, the device region 3705 may comprise one or more additional layers, including without limitation, a buffer layer 210, a semiconductor active area, a gate insulating layer 230, an electrode layer for forming a source electrode and/or a drain electrode (TFT electrode layer), an interlayer insulating layer 250 and/or an insulating layer for forming the TFT structure 200.

In some non-limiting examples, the device 3700 further comprises an outcoupling layer (not shown) arranged between the second electrode 140 and the encapsulation layer.

In some non-limiting examples, the auxiliary layer comprises a capping layer. By way of non-limiting examples, such capping layer may act to enhance the outcoupling of light from the device 3700, thus increasing the efficiency and/or brightness of the device 3700. In some non-limiting examples, the auxiliary layer includes an electrically conductive layer. In some non-limiting examples, the electrically conductive layer may act as an auxiliary electrode 1750, which may be electrically coupled to the second electrode 140. In some non-limiting examples, the presence of such auxiliary electrode 1750 may reduce an effective sheet resistance of the second electrode 120.

In some non-limiting examples, the auxiliary layer includes the properties of both the capping layer and the auxiliary electrode 1750. In some non-limiting examples, the auxiliary layer includes a transparent conductive oxide (TCO), including without limitation, indium zinc oxide (IZO), fluorine tin oxide (FTO), and/or indium tin oxide (ITO) and/or combinations thereof in at least one layer, any one or more of which may be, without limitation, a thin film. Those having ordinary skill in the relevant art will appreciate that in some non-limiting examples, such TCOs may exhibit optical properties suited for use as the capping layer, while also exhibiting electrical properties suited for use as the auxiliary electrode 1750. In some non-limiting examples, the auxiliary layer is, or may include, an IZO layer having a thickness of between 20 nm and about 100 nm, between about 25 nm and about 80 nm and/or between about 30 nm and about 60 nm. In some non-limiting examples, the auxiliary layer may also include an organic material to act as the capping layer and/or a portion thereof.

Without wishing to be bound by any particular theory, it is postulated that including an auxiliary layer that exhibits the properties of the capping layer and the auxiliary electrode 1750 may be advantageous in some non-limiting examples, in which: (i) the second electrode 140 is patterned with discrete or discontinuous features, and/or (ii) the thickness of the second electrode 140 is relatively thin, such that the current-resistance (IR) drop across the display 3700 without an auxiliary electrode 1750 may reduce device performance.

In some non-limiting examples, the auxiliary layer may be applied as a common layer. In some non-limiting examples, the auxiliary layer is provided in both the light transmissive regions 2620 and the emissive regions 1910.

In some non-limiting examples, the device 3700 further comprises additional layers, coatings and/or components. By way of non-limiting examples, although not shown, the device 3700 may comprise at least one of a polarizer, a wave plate, a touch sensor, a color filter, a cover glass and/or an adhesive, which may be arranged beyond the device region 3705.

In some non-limiting examples, the device 3700 is an OLED display device. In some non-limiting examples, such device 3700 may be an AMOLED display device in which the at least one semiconducting layer 130 generally includes an emitter layer, which may be formed, by way of non-limiting example, by doping a host material with an emitter material, including without limitation, a fluorescent emitter, a phosphorescent emitter and/or a TADF emitter. In some non-limiting examples, a plurality of emitter materials may be doped into the host material to form the emitter layer.

In some non-limiting examples, elements, coatings and/or materials that are opaque or substantially limit and/or prevent transmission of light incident on an external surface thereof to pass through the light transmissive regions 2620 of the device 3700 may be arranged to be omitted from the light transmissive regions 2620, such that externally-incident light may be transmitted through the device 3700, in some non-limiting examples so as to pass entirely through the user device 3750 of which the device 3700 forms a face 3940, and/or in some non-limiting examples, to be incident on the transceiver 3970 within the user device 3950 beyond the face 3940 thereof defined by the device 3700 without substantial interference and/or signal degradation.

In some non-limiting examples, the backplane layer of the device 3700 may include at least one TFT structure 200 and/or conductive traces electrically coupled thereto. Since, in some non-limiting examples, the materials to form such TFT structures 200 and/or the conductive traces may exhibit relatively low light transmittance, in some non-limiting examples, the TFT structures 200 and/or conductive traces may be omitted from the light transmissive regions 2620.

In some non-limiting examples, such TFT structures 200 and/or conductive traces may be omitted from the light transmissive regions 2620 by arranging such elements to lie within the lateral aspect 410 of the emissive regions 1910, including as shown by way of non-limiting example, in FIG. 3.

In some non-limiting examples, one or more layers of the backplane layer may be omitted from all or a part of at least one of the light transmissive regions 2620, including without limitation, one or more of the buffer layer 210, the semiconductor active area, the gate insulating layer 230, the interlayer insulating layer 250, the TFT electrode layer, and/or the insulating layer for forming the TFT structure 200.

In some non-limiting examples, one or more layers of the frontplane may be omitted from all or a part of at least one of the light transmissive regions 2620, including without limitation, one or more of the material(s) used to form the first electrode 120, the PDL 440, the at least one semiconducting layer 130 and/or layers thereof and/or the second electrode 140.

In some non-limiting examples, the TFT insulating layer 280, the at least one semiconducting layer 130 and/or layers thereof and/or the encapsulation layer may be substantially light-transmissive such that providing such layers within all or a part of at least one of the light transmissive regions 2620 may not substantially affect transmission of external light therethrough. Accordingly, in some non-limiting examples, such layers may continue to be provided within all or a part of at least one of the light transmissive regions 2620.

The light transmissive region 2620 extends along at least part of the lateral aspect 420 of non-emissive regions 1920. As is shown by dashed outline, in some non-limiting examples, at least some of the backplane and/or frontplane layers are omitted from all or a part of the at least one light transmissive region 2620 to facilitate transmission of light therethrough.

Turning now to FIG. 4A, there is shown a simplified view of a cross-section of a version of the device 3700, shown as device 3900*a*, according to an example. The device 3900*a* serves as the face 3940 of the user device 3950 that has a body 3960 for housing a variety of components, including the at least one transceiver 3970.

The device 3900*a* forming the face 3940 of the user device 3950 extends to substantially cover the body 3960 and the components thereof, including the transceiver 3970.

In the device 3900*a*, the device region 3705 is disposed over the substrate 110 and the device 3900*a* comprises emissive regions 1910 and light transmissive regions 2620 in an alternate arrangement along at least one array axis in a direction parallel to the plane of the substrate 110. By way of non-limiting example, the device 3900*a* may be configured to substantially inhibit transmission of external light incident thereon from a direction that is substantially transverse to the plane of the surface of the device 3900*a*, that is, along axis 3702, other than through all or a part of the at least one light transmissive region 2620.

In some non-limiting examples, the device 3900*a* may be substantially opaque, except within all or a part of the lateral aspect 420 of at least one of the light transmissive regions 2620. By way of non-limiting example, although not explicitly shown in the figure, opaque and/or light-attenuating layers, coatings and/or materials for forming various parts of the device 3900*a* may be arranged beyond the lateral aspects 420 of the light transmissive regions 2620, such that certain parts of the device 3900*a* including the emissive regions 1910 are substantially opaque and substantially preclude the transmission of light, while the light transmissive regions 2620 allow passage of external light incident thereon therethrough.

In some non-limiting examples, the device 3700 further includes at least one opaque coating 3910. In some non-limiting examples, such opaque coating 3910 may comprise a plurality of apertures 3920 each defining the closed boundary 3701 of a corresponding light transmissive region 2620. Such opaque coating 3910 may, in some non-limiting examples, be configured to permit transmission of light through the apertures 3920 and thus through the closed boundary 3701 of the light transmissive regions 2620 defined thereby.

In some non-limiting examples, the opaque coating 3910 may be configured to reduce transmission of light therethrough other than through the apertures 3920 thereof. By way of non-limiting example, the opaque coating 3910 may reduce transmission of light by about 30% or greater, about 40% or greater, about 50% or greater, about 60% or greater, about 70% or greater, about 80% or greater, about 90% or greater and/or about 95% or greater. In some non-limiting examples, the transmission of light through the apertures 3920 may be substantially unaffected.

In some non-limiting examples, the opaque coating 3910 may be configured to filter any external light incident thereon, such that light may be selectively transmitted through the apertures 3920 that define the light transmissive regions 2620.

In some non-limiting examples, the opaque coating 3910 may be configured to reflect any external light incident thereon other than the apertures 3920. In some non-limiting examples, the opaque coating 3910 may be formed of a material and/or otherwise configured to absorb any external light incident thereon other than the apertures 3920.

Figure 4C:
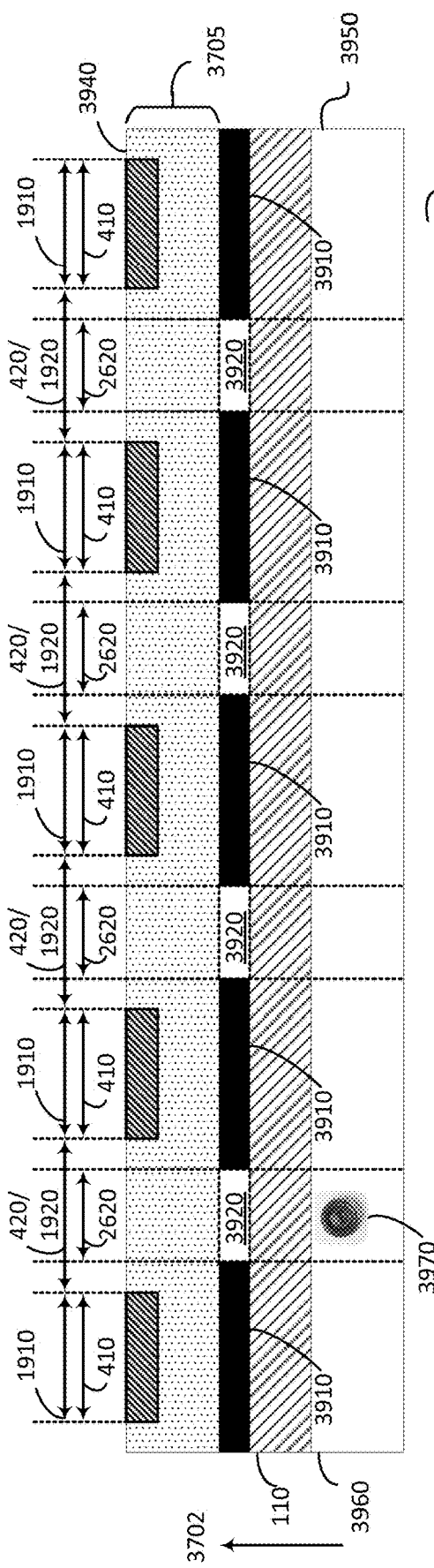

FIGS. 4B-4F show various non-limiting examples of different locations of such opaque coating 3910 throughout the simplified view of the device 3700 shown in FIG. 4A.

FIG. 4B shows a version 3900*b* of the device 3700, according to an example, in which the opaque coating 3910 is disposed on a surface of the substrate 110 that is opposite to the exposed surface 111 of the substrate 110 upon which the device region 3705 is disposed. The light transmissive regions 2620 are substantially devoid of the material for forming the opaque coating 3910 and accordingly, the transmission of external light through the apertures 3920 and the associated light transmissive regions 2620 is substantially unaffected. The opaque coating 3910 is arranged to extend across the lateral aspect 410 of the emissive regions 1910 and across the lateral aspect 420 of the non-emissive regions 1920 other than the apertures 3920 that define the light transmissive regions 2620 (intermediate regions) between adjacent emissive regions 1910 and/or light transmissive regions 2620. As a result, by way of non-limiting example, any transmission of external light incident on the emissive regions 1910 and/or the intermediate regions is substantially inhibited, including without limitation due to the presence of the opaque coating 3910. In some non-limiting examples, this may allow external light incident on the device 3900*b* to be selectively transmitted in certain configurations as discussed below.

FIG. 4C shows a version 3900*c* of the device 3700, according to an example, in which the opaque coating 3910 is disposed between the substrate 110 and the device region 3705 deposited on an exposed surface 111 thereof. The opaque coating 3910 is arranged to extend across the lateral aspect 410 of the emissive regions 1910 and across the lateral aspect 420 of the intermediate regions such that, by way of non-limiting example, any transmission of external light incident on the emissive regions 1910 and/or the intermediate regions is substantially inhibited, including without limitation due to the presence of the opaque coating 3910. In some non-limiting examples, the opaque coating 3910 may be disposed on the exposed surface 111 of the substrate 110 prior to deposition of the materials for forming the TFT structures 200 in the device region 3705 such that the TFT structures 200 lie between the opaque coating 3910 and the at least one first electrode 120.

Figure 4D:
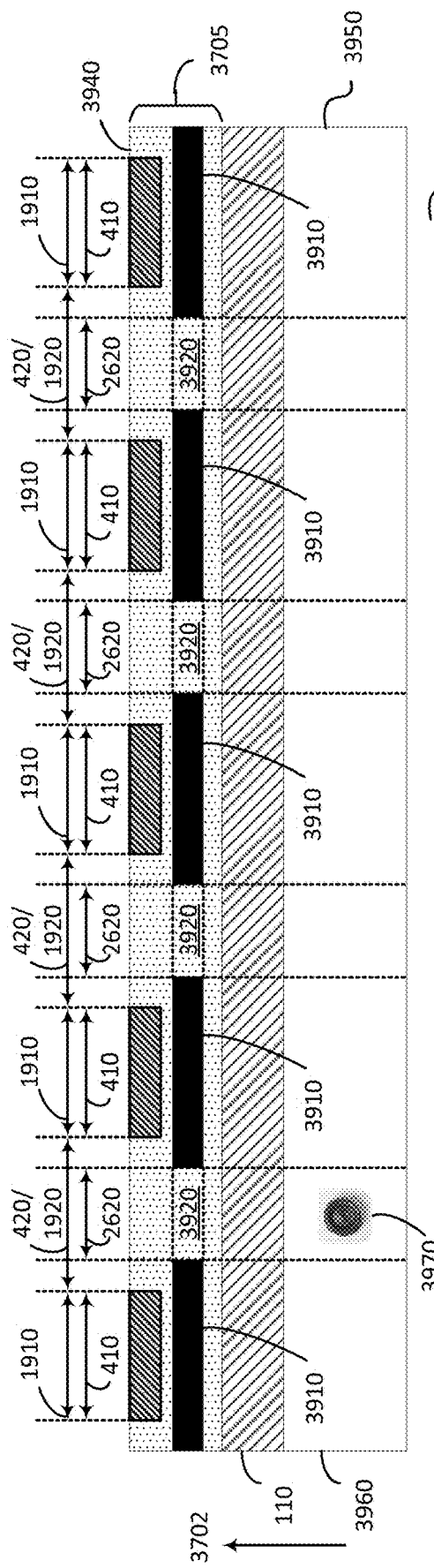

FIG. 4D shows a version 3900d of the device 3700, according to an example, in which the opaque coating 3910 is arranged within the device region 3705. The opaque coating 3910 is arranged to extend across the lateral aspect 410 of the emissive regions 1910 and across the lateral aspect 420 of the intermediate regions such that, by way of non-limiting example, any transmission of external light incident on the emissive regions 1910 and/or the intermediate regions is substantially inhibited, including without limitation due to the presence of the opaque coating 3910. By way of non-limiting example, the opaque coating 3910 may be provided in and/or by one or more layers of materials(s) for: forming the TFT structure 200, forming the first electrode 120, forming the PDL 440 and/or for forming the second electrode 140. In some non-limiting examples, the opaque coating 3910 may be formed using materials in addition to such material(s). In some non-limiting examples, the opaque coating 3910 is disposed between the emissive region 1910 and the substrate 110. In some non-limiting examples, the opaque coating 3910 may be disposed on an exposed surface 111 of the TFT insulating layer 280. In some non-limiting examples, the opaque coating 3910 may be arranged substantially in the same plane as the first electrode 120.

Figure 4E:
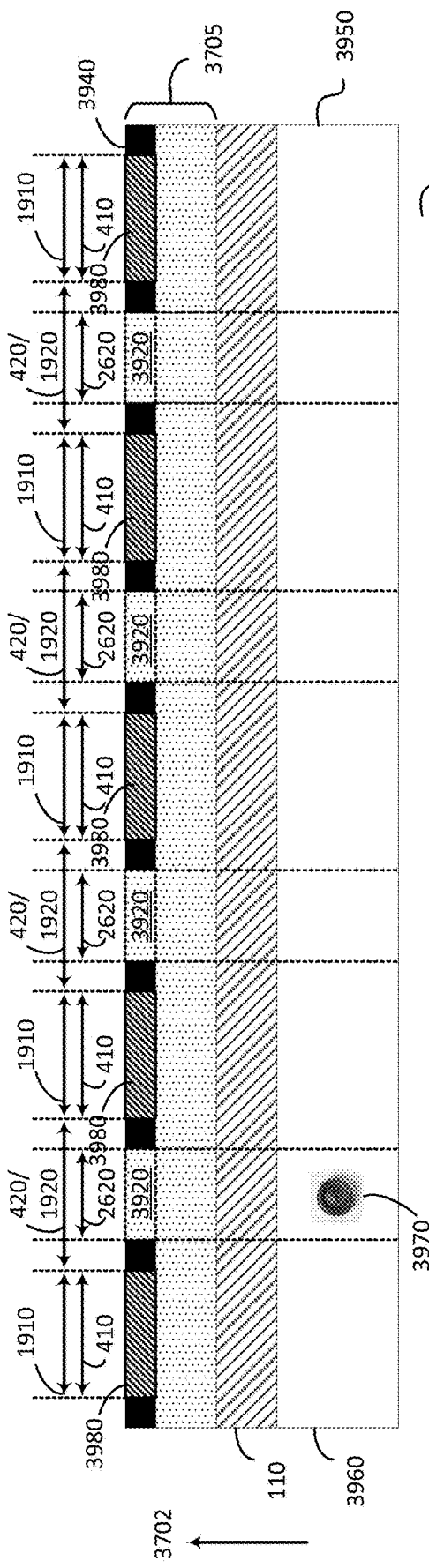

FIG. 4E shows a version 3900e of the device 3700, according to an example, in which the opaque coating 3910 is arranged within the device region 3705 but does not substantially overlap with the emissive regions 1910 of the device 3900e, such that both the emissive regions 1910 and the light transmissive regions 2620 are substantially devoid of the material for forming the opaque coating 3910. Rather, the opaque coating 3910 is arranged to be substantially confined to and to extend across the lateral aspect 420 of the intermediate regions such that, by way of non-limiting example, any transmission of external light incident on the intermediate regions is substantially inhibited, including without limitation to the presence of the opaque coating 3910. In some non-limiting examples, the opaque coating has at least one opening 3980 that is coincident with the at least one emissive region 1910 to permit light emitted by such corresponding at least one emissive region 1910 to emit light and to have such light to pass through the opaque coating 3910. In some non-limiting examples, such configuration may be appropriate where the emissive regions 1910 are substantially opaque. In some non-limiting examples, the opaque coating 3910 may be formed by, and/or as part of the PDL 440 and/or by, and/or as part of the second electrode 140 such that the opaque coating is deposited on a same layer as the second electrode 140 and such that the opaque coating 3910 has at least one opening 3980 that lies within the PDL 440 coincident with the at least one emissive region 1910 to permit light emitted by such corresponding at least one emissive region 1910 to emit light and to have such light to pass through the opaque coating 3910. In some non-limiting examples, the opaque coating 3910 may be disposed over the second electrode 140. By way of non-limiting example, the opaque coating 3910 may be an electrically conductive material, including without limitation, a metal, that is electrically and/or physically coupled to the second electrode 140. In such non-limiting example, the opaque coating 3910 may also act as an auxiliary electrode 1750 for reducing an effective sheet resistance of the second electrode 140. In some non-limiting examples, the opaque coating 3910 may be arranged to be deposited over the second electrode 140, so as to lie between the second electrode 140 and the encapsulation layer.

Figure 4F:
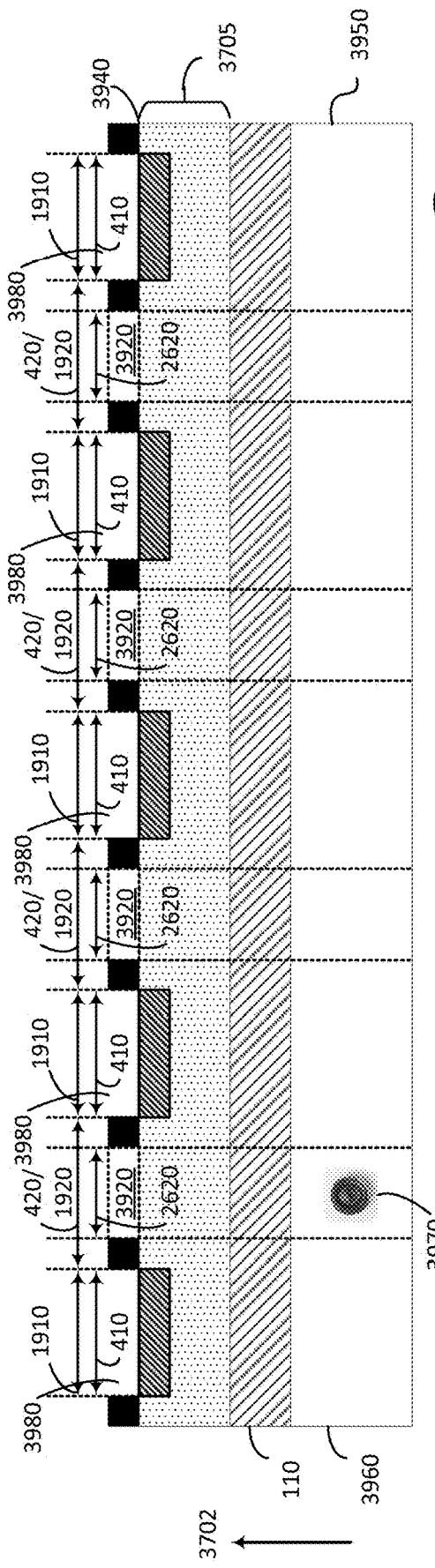

FIG. 4F shows a version 3900f of the device 3700, according to an example, in which the opaque coating 3910 is disposed on and/or over the device region 3705 but does not substantially overlap with the emissive regions 1910 of the device 3900f (by virtue of openings 3980 therewithin), such that both the emissive regions 1910 and the light transmissive regions 2620 are substantially devoid of the material for forming the opaque coating 3910 and accordingly, the transmission of external light through the emissive regions 1910 and through the apertures 3920 and the associated light transmissive regions 2620 is substantially unaffected. Rather, the opaque coating 3910 is arranged to be substantially confined to and to extend across the lateral aspect 420 of the intermediate regions such that, by way of non-limiting example, any transmission of external light incident on the intermediate regions is substantially inhibited, including without limitation to the presence of the opaque coating 3910. In some non-limiting examples, the opaque coating 3910 may be disposed over the encapsulation layer in some non-limiting examples, each light transmissive region 2620 may be substantially devoid of the second electrode 140. In some non-limiting examples, the device 3700 may comprise a patterning coating, such as, without limitation, an NIC 810, disposed within the closed boundary 3701 of each light transmissive region 2620 defined by a corresponding aperture 3920, to preclude deposition of a conductive coating 830 thereon to form the second electrode 140 therein. By way of non-limiting example, the at least one semiconducting layer 130 may extend laterally across the light transmissive regions 2620 and the NIC 810 may be disposed thereon within the light transmissive regions 2620. In some non-limiting examples, the emissive regions 1910 may be substantially devoid of the NIC 810.

Those having ordinary skill in the relevant art will appreciate that in some non-limiting examples, a patterning coating, including without limitation, an NIC 810, may be deposited on a first portion of an exposed layer surface 111 to substantially preclude deposition within such first portion of a coating, that may not necessarily be electrically conductive. By way of non-limiting example, such first portion may comprise the entirety of the lateral aspects 420 of the non-emissive regions 1920 other than those of the light transmissive regions, so as to facilitate deposition of the opaque coating 3910 with apertures 3920 corresponding only to the light transmissive regions 2620. By way of further non-limiting examples, such first portion may further comprise the lateral aspects 410 of the emissive regions 1910 so as to facilitate deposition of the opaque coating 3910 with both apertures 3920 corresponding only to the light transmissive regions 2620 and openings 3980 corresponding to the emissive regions 1910.

In some non-limiting examples, the opaque coating 1910 deposited on the patterning coating, which may in some non-limiting examples be the NIC 810, may comprise a purely optical non-conductive coating or an electrically conductive coating 830 that also has optical coating characteristics.

In some non-limiting examples, the light transmissive regions 2620 may be substantially devoid of the PDL 440. By way of non-limiting example, such configuration may further enhance light transmission through the light transmissive regions 2620, including without limitation, by mitigating distortion of a color and/or associated wavelength spectrum of the external light transmitted therethrough.

In some non-limiting examples, a distinctive and non-uniform diffraction pattern, affected by the shape of the closed boundary 3701 of the light transmissive regions 2620 defined by a corresponding aperture 3920, may cause interference that distorts the external light transmitted therethrough, and may adversely impact an ability to facilitate mitigation of interference caused by the diffraction pattern.

In some non-limiting examples, a distinctive and non-uniform diffraction pattern may result from a shape of an aperture 3920 that causes distinct and/or angularly separated diffraction spikes in the diffraction pattern.

In some non-limiting examples, a first diffraction spike may be distinguished from a second proximate diffraction spike by simple observation, such that the total number of diffraction spikes along a full angular revolution may be counted. However, in some non-limiting examples, especially where the number of diffraction spikes is large, it may be more difficult to identify individual diffraction spikes. In such circumstances, the distortion effect of the resulting diffraction pattern may in fact facilitate mitigation of the interference caused thereby, since the distortion effect tends to be blurred and/or distributed more evenly distributed. Such blurring and/or more even distribution of the distortion effect may, in some non-limiting examples, be more amenable to mitigation, including without limitation, by optical post-processing techniques, in order to recover the original image and/or information contained therein.

In some non-limiting examples, the ability to facilitate mitigation of the interference caused by the diffraction pattern may increase as the number of diffraction spikes increases. In some non-limiting examples, beneficial increases in the ability to facilitate mitigation of the interference caused by the diffraction pattern may be reflected in a number of diffraction spikes in the diffraction pattern across a full angular revolution that is greater than about 4, greater than about 6, greater than about 8, greater than about 10, greater than about 12, greater than about 14 and/or greater than about 16.

In some non-limiting examples, a distinctive and non-uniform diffraction pattern may result from a shape of an aperture 3920 that increases a length of a pattern boundary $P_B$ (FIG. 8B) within the diffraction pattern between region(s) of high intensity of light and region(s) of low intensity of light as a function of a pattern circumference $P_C$ (FIG. 8B) of the diffraction pattern and/or that reduces a ratio of the pattern circumference $P_C$ relative to the length of the pattern boundary $P_B$ thereof.

In some non-limiting examples, beneficial increases in the ability to facilitate mitigation of the interference caused by the diffraction pattern may be reflected in a ratio of the pattern circumference $P_C$ of the diffraction pattern relative to the length of the pattern boundary $P_B$ that is greater than about 0.4, greater than about 0.5, greater than about 0.6, greater than about 0.7, greater than about 0.75, greater than about 0.8, greater than about 0.9 and/or greater than about 0.95.

Without wishing to be bound by any specific theory, it is postulated that devices 3700 having closed boundaries 3701 of light transmissive regions 2620 defined by a corresponding aperture 3920 that are polygonal may exhibit a distinctive and non-uniform diffraction pattern that adversely impacts an ability to facilitate mitigation of interference caused by the diffraction pattern relative to devices 3700 having closed boundaries 3701 of light transmissive regions 2620 defined by a corresponding aperture 3920 that is non-polygonal.

In the present disclosure, the term "polygonal" may refer generally to shapes, figures, closed boundaries 3701 and/or perimeters formed by a finite number of linear and/or straight segments and the term "non-polygonal" may refer generally to shapes, figures, closed boundaries 3701 and/or perimeters that are not polygonal. By way of non-limiting example, a closed boundary 3701 formed by a finite number of linear segments and at least one non-linear or curved segment is considered non-polygonal.

Without wishing to be bound by a particular theory, it is postulated that when the closed boundary 3701 of the light transmissive regions 2620 defined by a corresponding aperture 3920 comprises at least one non-linear and/or curved segment, external light incident thereon and transmitted therethrough may exhibit a less distinctive and/or more uniform diffraction pattern that facilitates mitigation of interference caused by the diffraction pattern.

In some non-limiting examples, a device 3700 having a closed boundary 3701 of the light transmissive regions 2620 defined by a corresponding aperture 3920 that is substantially elliptical and/or circular may further facilitate mitigation of interference caused by the diffraction pattern.

In some non-limiting examples, the closed boundary 3701 of the light transmissive regions 2620 defined by the apertures 3920 may be symmetrical relative to at least one of the configuration axes 3703, 3704.

A wide variety in shapes and configurations of closed boundaries 3701 of such light transmissive regions 2620 defined by the apertures 3920 may be appropriate. FIGS. 5A-5I illustrate non-limiting examples of an array of light transmissive regions 2620 (for purposes of simplicity of illustration, the intervening emissive region(s) 1910 have been omitted).

In some non-limiting examples, such as those shown in FIGS. 5A-5C, the closed boundaries 3701 of each light transmissive region 2620 defined by the apertures 3920 in an array thereof may be substantially elliptical. In some non-limiting examples, such boundaries 3701 may be oriented to be symmetrical about at least one of the configuration axes 3703, 3704.

In some non-limiting examples, such as those shown in FIGS. 5D-5G, the closed boundaries 3701 of each light transmissive region 2620 defined by the apertures 3920 in an array thereof may be defined by a finite plurality of convex rounded segments. In some non-limiting examples, at least some of these segments coincide at concave notches or peaks.

FIG. 5H shows, by way of non-limiting example, the closed boundaries 3701 of each light transmissive region 2620 defined by the apertures 3920 in an array thereof may be defined by a finite plurality of concave rounded segments. In some non-limiting examples, at least some of these segments coincide at convex notches or peaks.

FIG. 5I shows, by way of non-limiting example, the closed boundaries 3701 of each light transmissive region 2620 defined by the apertures 3920 in an array thereof may be defined by a finite plurality of linear segments joined at their ends by rounded corners. In the example shown, the closed boundary 3701 comprises four linear segments to define a rounded rectangle.

In some non-limiting examples, the closed boundaries 3701 of each light transmissive region 2620 defined by the apertures 3920 in an array thereof has a common shape. In some non-limiting examples, the closed boundaries 3701 of the light transmissive regions 2620 defined by the apertures 3920 in an array thereof may be of different sizes and/or shapes.

Figure 6:
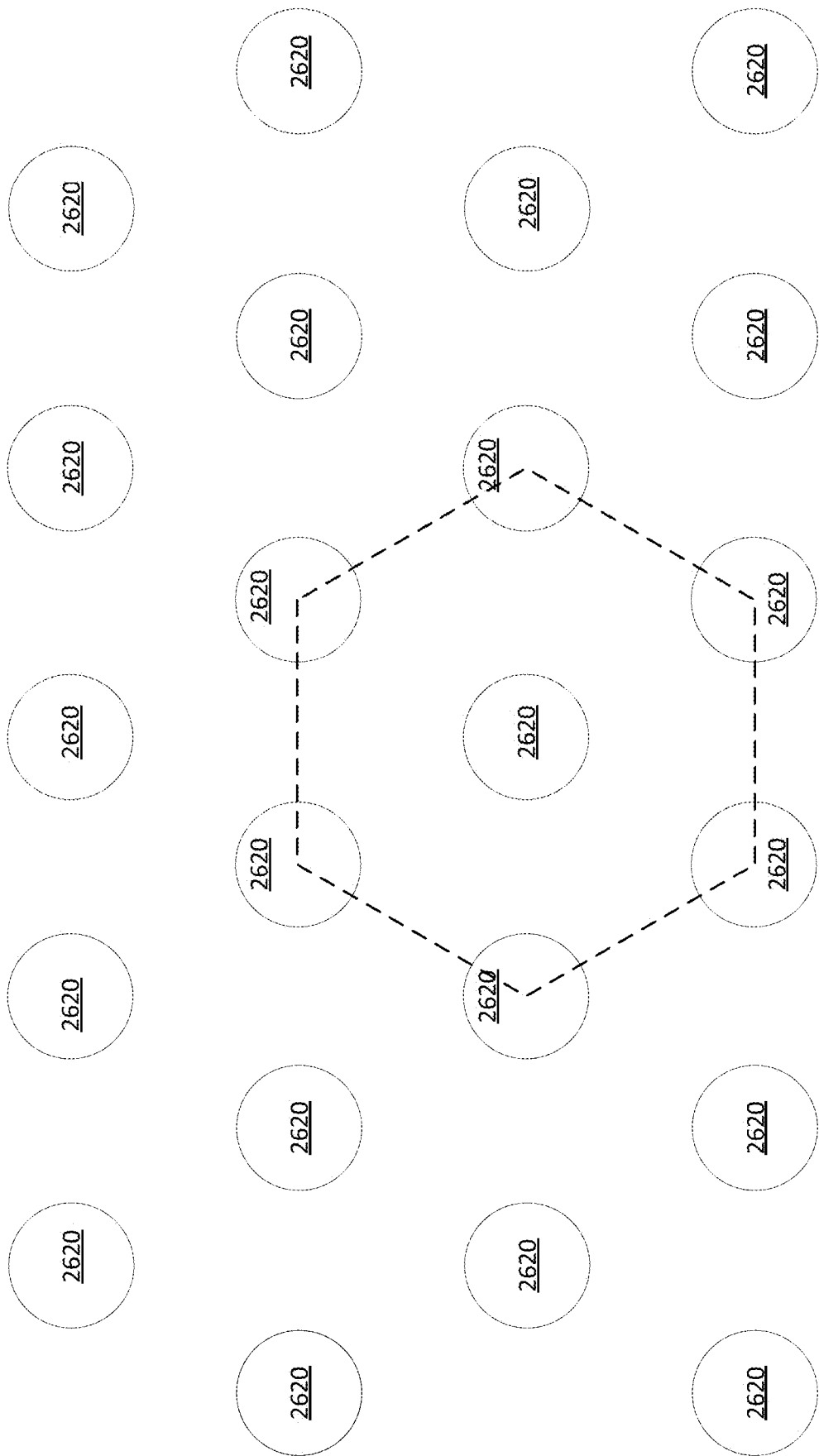
FIG. 6 is a schematic diagram illustrating, in plan view, of an example configuration of light transmissive regions in a repeating hexagonal arrangement, according to an example in the present disclosure.

In some non-limiting examples, the light transmissive regions 2620 of a device 3700 may be arranged in various configurations, including without limitation, polygonal, including without limitation, triangular (including without limitation trigonal), square, rectangular, parallelogram and/or hexagonal arrangements, the latter of which is shown by way of non-limiting example in FIG. 6.

In some non-limiting examples, where the configuration is polygonal, the configuration may be aligned along a plurality of configuration axes 3703, 3704 that define the respective sides of a polygon defined by such configuration, in which light transmissive regions 2620 form vertices thereof. In some non-limiting examples, one or more light transmissive regions 2620 may be located within such polygon.

However configured, in some non-limiting examples, closed boundaries 3701 of the light transmissive regions 2620 defined by the apertures 3920 may be interspersed with at least one neighboring emissive region 1910 in an alternating pattern along at least one configuration axis 3703, 3704.

EXAMPLES

The following examples are for illustrative purposes only and are not intended to limit the generality of the present disclosure in any fashion.

Figure 7:
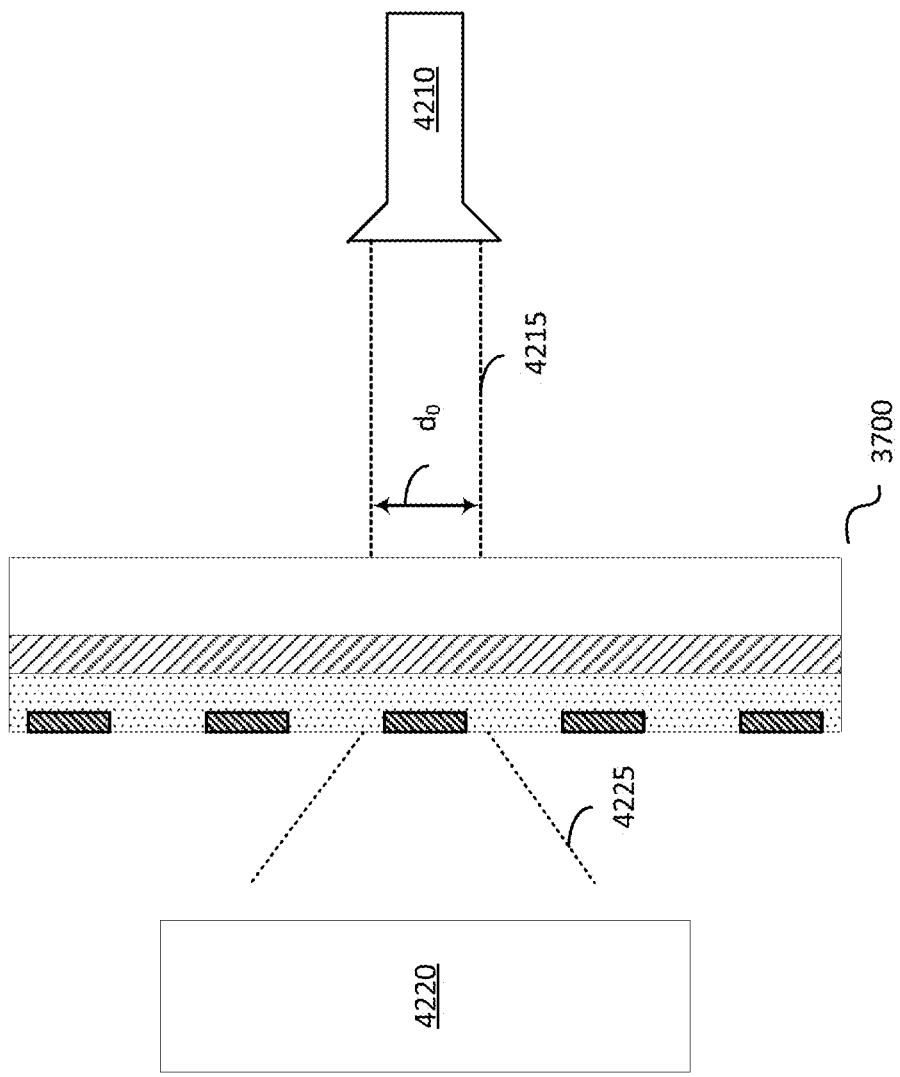
FIG. 7 is a schematic diagram illustrating an example configuration for analysis of example device samples, according to an example in the present disclosure.

As shown by way of non-limiting example in FIG. 7, light was emitted by an external source 4210 to be incident on and transmitted through a plurality of sample OLED devices 3700 having various example configurations of closed boundaries 3701 of such light transmissive regions 2620 defined by the apertures 3920. By way of non-limiting examples, a camera was used as the detector 4220 to capture an image of the light 4225 emitted by the source 4210 incident on the sample device 3700 and transmitted therethrough by the light transmissive regions 2620. As shown schematically in the figure, the light emitted by the source 4210 is in the form of a collimated circular cylindrical beam 4215 having a diameter or spot size of do. Also as shown schematically in the figure, after passing through the device 3700 and in particular, the closed boundaries 3701 of the light transmissive regions 2620 thereof defined by the apertures 3920, the light 4225 captured by the detector 4220 may be a divergent beam as a result of diffraction characteristics imparted to the light 4225 by the shape of the closed boundaries 3701 of the light transmissive regions 2620 defined by the apertures 3920.

In the figure, the source 4210 is shown as illuminating the substrate 110 of the sample device 3700 with the beam 4215, and the detector 4220 captures light 4225 that is emitted through the device region 3705. Those having ordinary skill in the art will appreciate that in some non-limiting examples, the orientation of the sample device 3700 may be reversed, such that the source 4210 illuminates the device region 3705 with the beam 4215, and the detector 4220 captures light 4225 that is emitted through the substrate 110.

Example 1

Figure 8A:
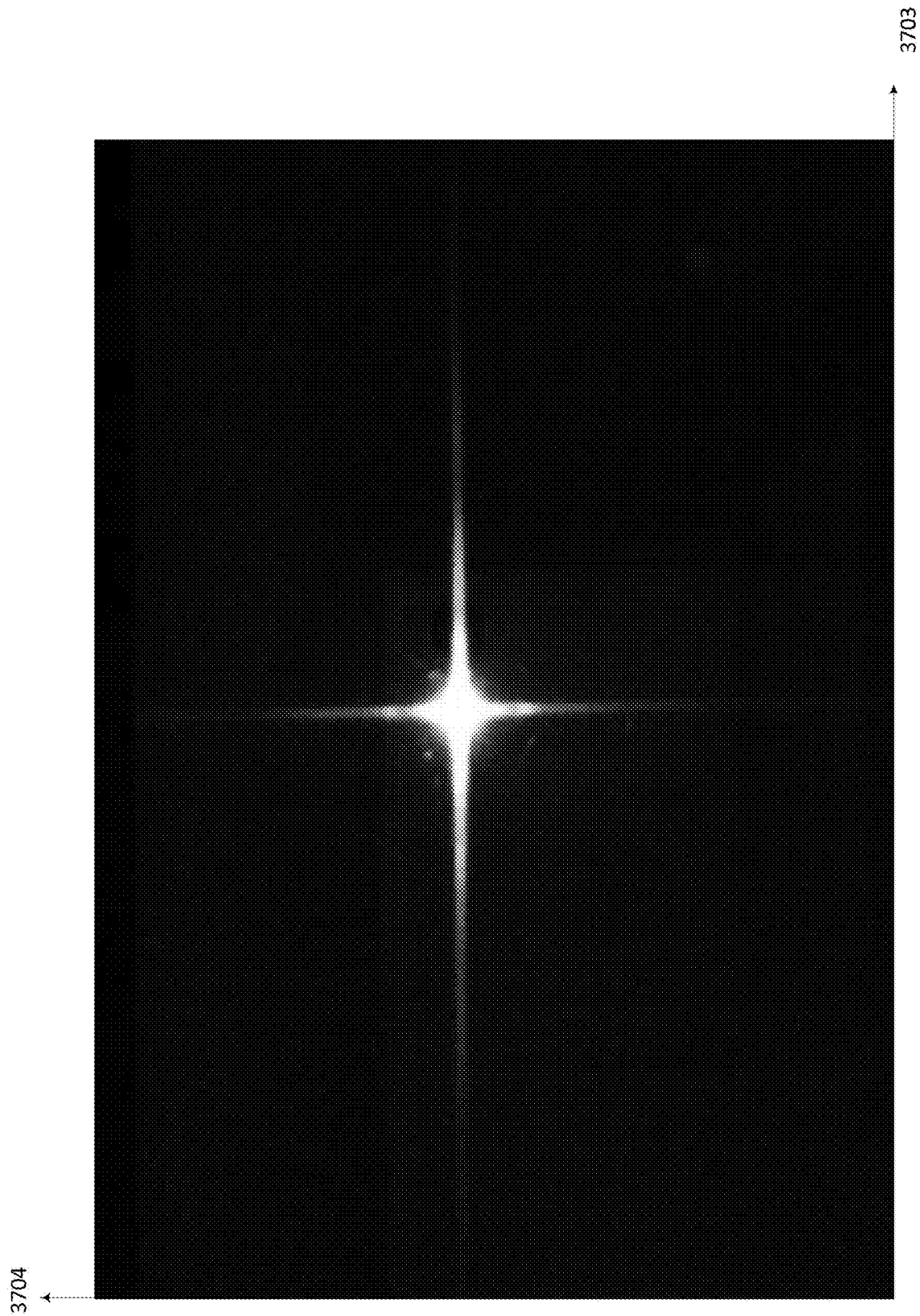
FIG. 8A is an image of a diffraction pattern captured when an example device sample fabricated according to an example in the present disclosure is submitted for analysis in the configuration of FIG. 7.

FIG. 8A is an image of the light 4225 captured by the detector 4220 for a first reference sample OLED device 3700, in which the closed boundaries 3701 of the light transmissive regions 2620 defined by the apertures 3920 are substantially rectangular, where the sides of the boundary 3701 are substantially aligned along two configuration axes 3703, 3704, at right angles.

Figure 8B:
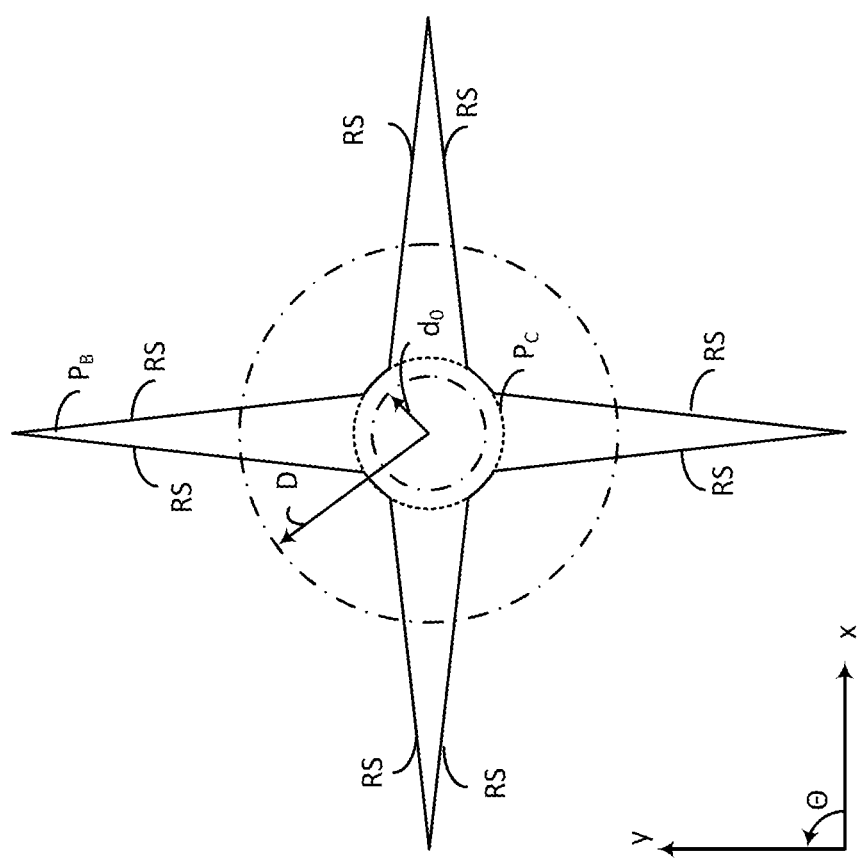
FIG. 8B is a schematic diagram of a diffraction pattern that corresponds to the image captured as FIG. 8A.

FIG. 8B is an idealized schematic representation of the diffraction pattern captured in the image of FIG. 8A, showing a small number of significant diffraction spikes aligned along the configuration axes 3703, 3704. As will be discussed in greater detail in respect of FIG. 9B, in some non-limiting examples, especially as the number of diffraction spikes increases and/or the ratio of the minimum intensity $I_{min}$ to the maximum intensity $I_{max}$ of the diffraction pattern approaches unity, it may become progressively more difficult to determine the number of diffraction spikes distributed across a complete angular revolution.

To this end, in some non-limiting examples, a mechanism for quantifying the number of diffraction spikes is to establish an arbitrary threshold diameter D from the center of the diffraction pattern. In some non-limiting examples, the diameter D may be about 3 times, about 4 times, about 5 times, about 7 times, about 10 times and/or about 15 times the spot size do. Once such diameter D has been established, a diffraction spike may be identified and/or distinguished from adjacent diffraction spikes by determining the number of instances in which the intensity of the diffraction pattern crosses the diameter D across a complete angular revolution (with the number of diffraction spikes corresponding to ½ of the number of such crossings). Those having ordinary skill in the relevant art will appreciate that the number of diffraction spikes thus identified may, in some non-limiting instances depend on the value of the diameter D, since if the diameter D exceeds the maximum intensity $I_{max}$ of a given diffraction spike, there will not be any crossings associated with such diffraction spike.

By way of non-limiting example, in an ideal situation, where there is substantially no diffraction imparted by the shape of the shape of the closed boundary 3701 of the light transmissive regions 2620 defined by a corresponding aperture 3920, the "diffraction" pattern obtained after being transmitted therethrough will be substantially circular, with no diffraction spikes. As such, the pattern boundary $P_B$ between region(s) of high intensity of light and region(s) of low intensity of light will be the circumference of such circular pattern, which will also be the pattern circumference $P_C$. Those having ordinary skill in the relevant art will appreciate that the length of such pattern boundary $P_B$ will be at a minimum for a given pattern circumference $P_C$.

However, as diffraction increases, so as to create diffraction spikes, such as shown in FIG. 8B, the pattern boundary $P_B$ will tend to comprise segments, corresponding to such diffraction spikes, that extend substantially radially away from the centre of the pattern, followed by segments RS that extend substantially radially toward the centre (collectively "radial segments"). Thus, the presence of such diffraction spikes tends to increase the length of the pattern boundary $P_B$ as a function of the pattern circumference $P_C$.

In the figure, the solid outline of the diffraction pattern reflects the boundary pattern $P_B$, while the dotted circular outline that overlaps the curved portions of the boundary pattern $P_B$ reflects the pattern circumference $P_C$ of the diffraction pattern. As can be seen, the length of the (in the FIG. 8) radial segments identified as RS are long and increase the length of the boundary pattern $P_B$, such that the ratio of the pattern circumference $P_C$ to the boundary pattern $P_B$ is considerably less than unity and may approach 0.

Example 2

Figure 9A:
FIG. 9A is an image of a diffraction pattern captured when an example device sample fabricated according to another example in the present disclosure is submitted for analysis in the configuration of FIG. 7.

FIG. 9A is an image of the light 4225 captured by the detector 4220 for a second sample OLED device 3700, in which closed boundaries 3701 of the light transmissive regions 2620 defined by the apertures 3920 are substantially circular.

Figure 9B:
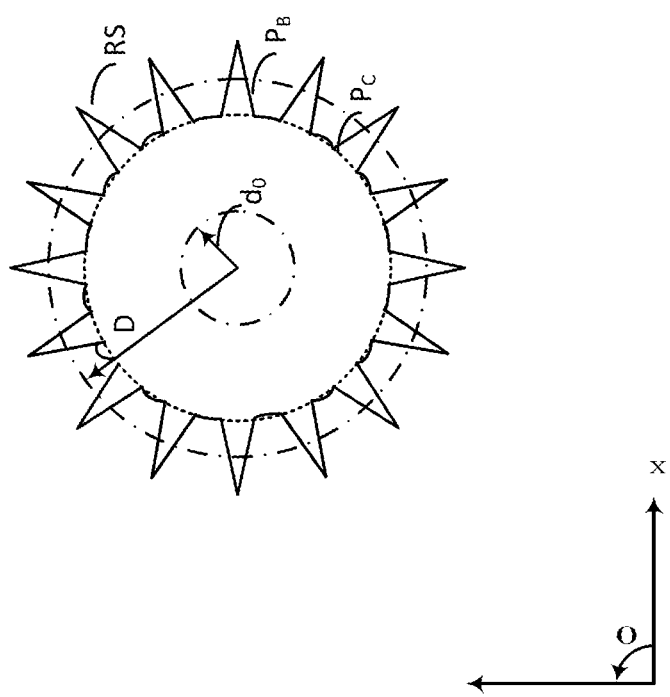
FIG. 9B is a schematic diagram of a diffraction pattern that corresponds to the image captured as FIG. 9A.

FIG. 9B is a schematic representation of a diffraction pattern for the captured image of FIG. 9A, showing a greater number of substantially evenly distributed diffraction spikes that vary in intensity by a substantially lesser degree. The increased number of diffraction spikes and the corresponding reduction in variation in intensity show a more uniform response that reflects a blurring of the diffraction pattern, which in some non-limiting examples, may facilitate mitigation of the interference of such diffraction pattern. Such mitigation may, in some non-limiting examples, result in substantial elimination thereof and/or a reduced amount of processing to achieve a comparable mitigation result.

As shown in the figure, the number of diffraction spikes increases. However, as it does, the diffraction spikes will tend to overlap, such that effectively, the pattern circumference $P_C$ of the resulting diffraction pattern increases, and the length of radial segments RS are reduced, with the result that the length of the pattern boundary $P_B$ will again be reduced as a function of the pattern circumference $P_C$ and/or the ratio of the pattern circumference to the length of the pattern boundary $P_B$ increases and approaches unity.

Terminology

References in the singular form include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" are used expansively and in an open-ended fashion, and thus should be interpreted to mean "including, but not limited to". The terms "example" and "exemplary" are used simply to identify instances for illustrative purposes and should not be interpreted as limiting the scope of the invention to the stated instances. In particular, the term "exemplary" should not be interpreted to denote or confer any laudatory, beneficial or other quality to the expression with which it is used, whether in terms of design, performance or otherwise.

The terms "couple" and "communicate" in any form are intended to mean either a direct connection or indirect connection through some interface, device, intermediate component or connection, whether optically, electrically, mechanically, chemically, or otherwise.

The terms "on" or "over" when used in reference to a first component relative to another component, and/or "covering" or which "covers" another component, may encompass situations where the first component is directly on (including without limitation, in physical contact with) the other component, as well as cases where one or more intervening components are positioned between the first component and the other component.

Amounts, ratios and/or other numerical values are sometimes presented herein in a range format. Such range formats are used for convenience, illustration and brevity and should be understood flexibly to include not only numerical values explicitly specified as limits of a range, but also all individual numerical values and/or sub-ranges encompassed within that range as if each numerical value and/or sub-range had been explicitly specified.

Directional terms such as "upward", "downward", "left" and "right" are used to refer to directions in the drawings to which reference is made unless otherwise stated. Similarly, words such as "inward" and "outward" are used to refer to directions toward and away from, respectively, the geometric center of the device, area or volume or designated parts thereof. Moreover, all dimensions described herein are intended solely to be by way of example of purposes of illustrating certain embodiments and are not intended to limit the scope of the disclosure to any embodiments that may depart from such dimensions as may be specified.

As used herein, the terms "substantially", "substantial", "approximately" and/or "about" are used to denote and account for small variations. When used in conjunction with an event or circumstance, such terms can refer to instances in which the event or circumstance occurs precisely, as well as instances in which the event or circumstance occurs to a close approximation. By way of non-limiting example, when used in conjunction with a numerical value, such terms may refer to a range of variation of less than or equal to ±10% of such numerical value, such as less than or equal to ±5%, less than or equal to ±4%, less than or equal to ±3%, less than or equal to ±2%, less than or equal to ±1%, less than or equal to ±0.5%, less than or equal to ±0.1%, and/or less than equal to ±0.05%.

As used herein, the phrase "consisting substantially of" will be understood to include those elements specifically recited and any additional elements that do not materially affect the basic and novel characteristics of the described technology, while the phrase "consisting of" without the use of any modifier, excludes any element not specifically recited.

As will be understood by those having ordinary skill in the relevant art, for any and all purposes, particularly in terms of providing a written description, all ranges disclosed herein also encompass any and all possible sub-ranges and/or combinations of sub-ranges thereof. Any listed range may be easily recognized as sufficiently describing and/or enabling the same range being broken down at least into equal fractions thereof, including without limitation, halves, thirds, quarters, fifths, tenths etc. As a non-limiting example, each range discussed herein may be readily be broken down into a lower third, middle third and/or upper third, etc.

As will also be understood by those having ordinary skill in the relevant art, all language and/or terminology such as "up to", "at least", "greater than", "less than", and the like, may include and/or refer the recited range(s) and may also refer to ranges that may be subsequently broken down into sub-ranges as discussed herein.

As will be understood by those having ordinary skill in the relevant art, a range includes each individual member of the recited range.

General

The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are considered to be merely illustrative of the scope of the present disclosure.

It should be appreciated that the present disclosure, which is described by the claims and not by the implementation details provided, and which can be modified by varying, omitting, adding or replacing and/or in the absence of any element(s) and/or limitation(s) with alternatives and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in one or more of the above-described examples, whether or not described an illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects and examples of the disclosure, as well as specific examples thereof, are intended to encompass both structural and functional equivalents thereof and to cover and embrace all suitable changes in technology. Additionally, it is intended that such equivalents include both currently-known equivalents as well as equivalents developed in the future, i.e., any elements developed that perform the same function, regardless of structure.

Accordingly, the specification and the examples disclosed therein are to be considered illustrative only, with a true scope of the disclosure being disclosed by the following numbered claims:

What is claimed is:

1. An opto-electronic display device comprising a substrate and a plurality of layers disposed on a first surface thereof, that extend laterally in a substantially lateral aspect, comprising:
   a plurality of light transmissive regions, each extending through the device in a direction extending substantially transversely to the lateral aspect and allowing passage of light therethrough;
   at least one emissive region disposed between adjacent light transmissive regions, each comprising first and second electrodes and at least one semiconducting layer therebetween, in layers, for emitting light from the device; and
   at least one opaque coating, for substantially precluding light transmission therethrough, and having at least one aperture therein defining a closed boundary of a corresponding light transmissive region;
   wherein at least one of the at least one semiconducting layer extends across the lateral aspect of at least one light transmissive region and a patterning coating is disposed on an exposed layer surface thereof within the lateral aspect of such light transmissive region to substantially preclude deposition of a closed conductive coating thereon to form the second electrode.

2. The display device of claim 1, wherein the at least one light transmissive region is substantially devoid of any light-attenuating component within the device.

3. The display device of claim 1, wherein the lateral aspect of at least one light transmissive region is substantially devoid of any second electrode.

4. The display device of claim 1, wherein the lateral aspect of at least one light transmissive region is substantially devoid of the at least one semiconducting layer.

5. The display device of claim 1, wherein the at least one opaque coating is substantially continuous in the lateral aspect between adjacent light transmissive regions.

6. The display device of claim 1, wherein the at least one light transmissive region is substantially devoid of any pixel definition layer (PDL).

7. The display device of claim 6, wherein the at least one emissive region is defined, in its lateral extent, by a lateral extent of an aperture in the PDL corresponding thereto.

8. The display device of claim 1, wherein a plurality of emissive regions is disposed between adjacent light transmissive regions.

9. The display device of claim 8, wherein the plurality of emissive regions corresponds to a pixel and each of the plurality of emissive regions therein corresponds to a sub-pixel thereof.

10. The display device of claim 1, further comprising at least one thin film transistor (TFT) structure corresponding to at least one emissive region and electrically coupled to at least one electrode thereof by at least one conductive trace, wherein the TFT structure and the at least one conductive trace are spaced apart in the lateral aspect from at least one of the light transmissive regions.

11. The display device of claim 10, wherein the at least one opaque coating overlaps, in the lateral aspect, at least one of: the TFT structure, and the at least one conductive trace.

12. The display device of claim 10, wherein the at least one TFT structure is disposed, in an aspect substantially transverse to the lateral aspect, between the opaque coating and the first electrode of the at least one emissive region.

13. The display device of claim 10, wherein the opaque coating is disposed, in an aspect substantially transverse to the lateral aspect, between the at least one TFT structure and the first electrode of the at least one emissive region.

14. The display device of claim 10, wherein the opaque coating is disposed, in an aspect substantially transverse to the lateral aspect, between the at least one TFT structure and the substrate.

15. The display device of claim 1, wherein the opaque coating is configured to substantially reduce transmission of light therethrough other than through the at least one aperture.

16. The display device of claim 1, wherein the at least one opaque coating is disposed on a second surface of the substrate opposed to the first surface thereof.

17. The display device of claim 1, wherein the at least one opaque coating is disposed on the first surface of the substrate.

18. The display device of claim 1, wherein the at least one opaque coating is disposed, in an aspect substantially transverse to the lateral aspect, between the at least one emissive region and the substrate.

19. The display device of claim 1, wherein the at least one opaque coating is disposed on a same layer as the second electrode of the at least one emissive region and further comprises at least one opening corresponding to the at least one emissive region, to permit light emitted thereby to pass therethrough.

20. The display device of claim 1, wherein the at least one opaque coating is disposed such that the second electrode of the at least one emissive region extends, in an aspect substantially transverse to the lateral aspect, between it and the at least one semiconducting layer, and wherein the at least one opaque coating further comprises at least one opening corresponding to the at least one emissive region, to permit light emitted thereby to pass therethrough.

21. The display device of claim 1, further comprising an encapsulation coating arranged between the second electrode of the at least one emissive region and the at least one opaque coating.

22. The display device of claim 1, further comprising a patterning coating disposed on an exposed layer surface in a portion of the lateral aspect to substantially preclude deposition of a closed coating thereon to form the at least one opaque coating.

23. The display device of claim 22, wherein the portion corresponds to the lateral aspect of at least one aperture.

24. The display device of claim 22, wherein the portion corresponds to the lateral aspect of the at least one emissive region.

25. The display device of claim 22, wherein the at least one aperture has a shape that alters at least one characteristic of a diffraction pattern exhibited when light is transmitted through the corresponding light transmissive region to facilitate mitigating interference caused by such diffraction pattern.

26. The display device of claim 1, wherein the boundary comprises at least one non-linear segment.

27. The display device of claim 1, wherein the boundary has a shape that is substantially at least one of: circular and elliptical.

28. The display device of claim 1, wherein the boundary has a shape that comprises at least one convex rounded segment.

29. The display device of claim 28, wherein two of the at least one convex rounded segments coincide at a concave notch.

30. The display device of claim 1, wherein the display device is a face of a user device comprising a body housing at least one transceiver for exchanging at least one electromagnetic signal through at least one light transmissive region.

* * * * *